United States Patent
Scarpulla

(10) Patent No.: US 9,859,448 B2
(45) Date of Patent: Jan. 2, 2018

(54) SINGLE-EVENT BURNOUT (SEB) HARDENED POWER SCHOTTKY DIODES, AND METHODS OF MAKING AND USING THE SAME

(71) Applicant: The Aerospace Corporation, El Segundo, CA (US)

(72) Inventor: John R. Scarpulla, Rancho Palos Verdes, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 15/149,020

(22) Filed: May 6, 2016

(65) Prior Publication Data
US 2017/0323982 A1 Nov. 9, 2017

(51) Int. Cl.
*H01L 29/47* (2006.01)
*H01L 29/872* (2006.01)
(Continued)

(52) U.S. Cl.
CPC ........ *H01L 29/872* (2013.01); *H01L 21/0217* (2013.01); *H01L 21/02057* (2013.01); *H01L 21/0262* (2013.01); *H01L 21/0273* (2013.01); *H01L 21/02532* (2013.01); *H01L 21/02595* (2013.01); *H01L 21/266* (2013.01); *H01L 21/28537* (2013.01); *H01L 21/31116* (2013.01); *H01L 23/291* (2013.01);
(Continued)

(58) Field of Classification Search
CPC ........... H01L 21/02057; H01L 21/0217; H01L 21/02532; H01L 21/02595; H01L 21/0262; H01L 21/266; H01L 21/28537; H01L 21/31116; H01L 23/291; H01L 23/3171; H01L 27/0248; H01L 29/872; H01L 29/0623; H01L 29/36; H01L 29/47; H01L 29/66143

See application file for complete search history.

(56) References Cited

U.S. PATENT DOCUMENTS

2011/0227152 A1* 9/2011 Hsu ................... H01L 29/66143
257/334
2016/0099306 A1* 4/2016 Cheng .................. H01L 29/402
257/476

OTHER PUBLICATIONS

Albadri et al., "Coupled Electro-Thermal Simulations of Single Event Burnout in Power Diodes," IEEE Transactions on Nuclear Science, 52(6):2194-2199 (2005).
(Continued)

*Primary Examiner* — Whitney T Moore
*Assistant Examiner* — Joseph Galvin, III
(74) *Attorney, Agent, or Firm* — Jones Day; Jaime D Choi

(57) ABSTRACT

Under one aspect, a power Schottky diode includes a cathode; a semiconductor disposed over the cathode, the semiconductor including at least a first region and a second region, the second region defining a guard ring; an anode disposed over the first region and at least a portion of the guard ring, the anode including a metal, a junction between the anode and the first region defining a Schottky barrier; and an oxide disposed over the guard ring. Additionally, the power Schottky diode can include a resistive material disposed over at least a portion of the guard ring and at least a portion of the oxide. The resistive material can inhibit a flow of holes from the guard ring to the anode following a heavy ion strike to the guard ring. The anode further can be disposed over at least a portion of, or the entirety of, the resistive material.

21 Claims, 18 Drawing Sheets

(51) Int. Cl.
| | |
|---|---|
| H01L 29/06 | (2006.01) |
| H01L 29/66 | (2006.01) |
| H01L 49/02 | (2006.01) |
| H01L 27/02 | (2006.01) |
| H01L 21/266 | (2006.01) |
| H01L 29/36 | (2006.01) |
| H01L 21/311 | (2006.01) |
| H01L 21/027 | (2006.01) |
| H01L 21/02 | (2006.01) |
| H01L 21/285 | (2006.01) |
| H01L 23/29 | (2006.01) |
| H01L 23/31 | (2006.01) |
| H03K 17/08 | (2006.01) |

(52) U.S. Cl.
CPC ...... *H01L 23/3171* (2013.01); *H01L 27/0248* (2013.01); *H01L 28/20* (2013.01); *H01L 29/0623* (2013.01); *H01L 29/36* (2013.01); *H01L 29/47* (2013.01); *H01L 29/66143* (2013.01); *H03K 17/08* (2013.01); *H03K 2017/0803* (2013.01)

(56) References Cited

OTHER PUBLICATIONS

Albadri et al., "Single Event Burnout in Power Diodes: Mechanisms and Models," Microelectronics Reliability, 46:317-325 (2006).

Baliga, "Power Semiconductor Devices," PWS Publishing (Boston), pp. 169-171 (1996).

George et al., "Single Event Burnout Observed in Schottky diodes," IEEE Radiation Effects Data Workshop, pp. 1-8 (2013).

Gigliuto et al., "Observed Diode Failures in DC-DC Converters," NASA—NEPP Electronic Technology Workshop, (Jun. 11-13, 2012), 15 pages.

Laird et al., "Relaxation of High-Energy Heavy-Ion Induced Bipolar Plasmas in Si Epilayer Devices as a Function of Temperature," Journal of Applied Physics ,104:084510-1-084510-9 (2008).

Mahajan, "Electro-Thermal Simulation Studies of Single-Event Burnout in Power Diodes," Master's Thesis, Vanderbilt University, Nashville, Tennessee, 68 pages (2006).

Ralston-Good, "Analysis of Schottky Diode Failure Mechanisms During Exposure to Electron Beam Pulse using TCAD Simulation," Masters Thesis, Vanderbilt University, Nashville, Tennessee, 68 pages (2002).

Soelkner et al., "Charge Carrier Avalanche Multiplication in High-Voltage Diodes Triggered by Ionizing Radiation," IEEE Transactions on Nuclear Science, 47(6):2365-2372 (2000).

Stavitski et al., "Systematic TLM Measurements of NiSi and PtSi Specific Contact Resistance to n- and p-Type Si in a Broad Doping Range," IEEE Electron Device Letters, 29(4):378-381 (2008).

Timsit, "Electrical Contact Resistance: Properties of Stationary Interfaces," IEEE Trans. Compon. Packag. Technol., 22(1):85-98 (1999).

Casey et al., "Destructive Single-Event Failures in Schottky Diodes," NEPP Electronic Technology Workshop, National Aeronautics and Space Administration, Greenbelt, MD, 13 pages (Jun. 11-12, 2012).

\* cited by examiner

Path of heavy ion strike

Path of heavy ion strike

SINGLE-EVENT BURNOUT (SEB) HARDENED POWER SCHOTTKY DIODES, AND METHODS OF MAKING AND USING THE SAME

STATEMENT OF GOVERNMENT INTEREST

This invention was made with government support under Contract No. FA8802-09-C-0001 awarded by the Department of the Air Force. The government has certain rights in the invention.

FIELD

This application relates to power Schottky diodes, and methods of making and using the same.

BACKGROUND

In the mid-1980's, high efficiency power converters became practical because of the introduction of new types of semiconductor switching devices, making possible higher switching frequencies, greater power efficiency, and smaller size and weight. Among other things, this has led to the incorporation of inverters, converters, switching regulators, and similar circuits into the power handling and distribution systems onboard satellites. A frequently used component in power circuits is the power Schottky rectifier diode (also referred to as a power Schottky diode). The power Schottky diode can be more efficient than the traditional PN-junction rectifier, having a lower forward voltage drop and a faster turn-off switching speed, because the forward conduction mode of the power Schottky diode involves majority carriers. For this reason, power Schottky diodes are now used frequently in power handling circuits in space applications, e.g., in satellites or space vehicles. Unfortunately, as discussed in greater detail below, previously known power Schottky diodes are vulnerable to SEB (single event burnout), which is not observable on Earth under normal conditions, but can be observed in the space environment where charged cosmic ray particles, e.g., heavy ions such as protons or atomic nuclei, can impinge upon the power Schottky diode, causing damage. There are believed to be hundreds or perhaps thousands of previously known power Schottky diodes now in power systems in space applications, which are believed to be vulnerable to SEB.

First, the construction of an exemplary, previously known power Schottky diode will be described. Then, a brief description of SEB will be provided.

FIGS. 1A-1B illustrate cross sections of an exemplary, previously known power Schottky diode. More specifically, FIG. 1A illustrates an overview of previously known power Schottky diode 100; the inset of FIG. 1A illustrates greater detail of certain features of diode 100 at an approximate, exemplary scale; and FIG. 1B illustrates greater detail of those certain features of diode 100 in an exaggerated scale so as to facilitate understanding. FIG. 2A, described in greater detail below, illustrates a plan view of certain components of an exemplary, previously known power Schottky diode, such as that illustrated in cross-section in FIGS. 1A-1B.

As illustrated in FIGS. 1A-1B, previously known power Schottky diode 100 includes substrate 110, active region 120, anode electrode 130 (which also may be referred to as a "top metal"), and cathode electrode 140 (which also may be referred to as a "back metal"). Active region 120 is disposed over a first surface of substrate 110, anode electrode 130 is disposed on active region 120, and cathode electrode 140 is disposed over a second surface of substrate 120 that is opposite to the first surface. In the previously known power Schottky diode 100 illustrated in FIGS. 1A-1B, substrate 110 is formed of silicon; anode electrode 130 includes aluminum and includes or is disposed on adhesion layer(s) 129b, such as titanium tungsten (TiW) for facilitating durable contact between anode electrode 130 and active region 120 and inhibiting "spiking" of metal into substrate 110 or into active region 120; and cathode electrode 140 includes a titanium layer followed by Au—Ge alloy or Ni/Au layered metal.

As perhaps best seen in FIG. 1B, active region 120 can include anode 121, semiconductor 122, and one or more oxide(s) 123. The portion of substrate 110 upon which active region 120 is disposed can be doped, e.g., $N^+$ doped, so as to define a cathode contact, which can be at substantially the same voltage as is cathode electrode 140. Semiconductor 122 can be disposed over the first surface of substrate 110, and can include epitaxially deposited silicon (which also can be referred to as "epi"). Different regions of semiconductor 122 can be doped differently than one another. In the illustrated example, a first region 125 of semiconductor 122 is lightly doped N-type during epitaxial deposition, so as to define a cathode region; a second region 124 of semiconductor 122 is doped so as to define a guard ring, e.g., a P-type guard ring; and a third region 126 of semiconductor 122 is also lightly doped N-type as part of the cathode that becomes depleted under reverse bias.

In the previously known power Schottky diode 100 illustrated in FIGS. 1A-1B, anode 121 is disposed over semiconductor 122 and at least a portion of guard ring 124, and includes platinum silicide ($PtSi_2$) or other suitable silicide, such as $MoSi_2$ (molybdenum silicide), $TiSi_2$ (titanium silicide), or others. Anode 121 can be at substantially the same voltage as is anode electrode 130, which is disposed over anode 121. For example, as is illustrated in FIG. 1B, anode 121 can be at a reverse voltage of −200 volts, and cathode (substrate) 110 can be at a voltage of 0 volts. A junction between anode 121 and semiconductor 122 can define a Schottky barrier in a manner well known in the art. The guard ring can reduce the electrical field gradient at the edge of the Schottky barrier in a manner well known in the art.

Oxide(s) 123 can include one or more discrete layers of oxide material. For example, oxide(s) 123 can include a first, relatively high quality and relatively thin oxide material 127 disposed over guard ring 124, and also can include a second, relatively low quality and relatively thick oxide material 128 disposed over the first oxide material. In the previously known power Schottky diode 100 illustrated in FIGS. 1A-1B, first oxide material 127 is formed of silicon dioxide ($SiO_2$), and second oxide material 128 is formed of tetraethyl ortho silicate (TEOS). Additionally, metal layer 129a, such as platinum, followed by refractory metal 129b such as TiW, can be disposed over second oxide material 128.

As shown in FIGS. 1A-1B, previously known power Schottky diode 100 can have a lateral dimension of approximately 60 mils and a thickness of approximately 12 mils. The region generally designated (A), defined by a lateral dimension between the outer edge of the guard ring defined by region 124 and the inner edge of second oxide material 128, can have a lateral dimension of approximately 1.5 mils. The region generally designated (B), defined by a lateral dimension between the inner edge of second oxide material 128 and the inner edge of first oxide material 127, can have a lateral dimension of approximately 1 mils. The region generally designated (C), defined by a lateral dimension between the inner edge of first oxide material 127 and the inner edge of guard ring 124, can have a lateral dimension of approximately 1 mils.

As noted above, the exemplary power Schottky diode illustrated in FIGS. 1A-1B includes a Schottky barrier defined by a junction between anode 121 and region 126. A depletion layer 126 forms in N-type epitaxial region 125 in the reverse biased or off state. In forward operation, electrons (majority carriers) in N-type epitaxial region 125 are able to surmount the energy barrier that exists at the metal-semiconductor interface defined by the junction between 121, 126 and can flow into anode electrode 130 (top metal). Note that the conventionally defined current flow is from anode 121 to cathode (substrate) 110 in forward bias (and electron flow is from cathode to anode in forward bias). The relatively light doping and relatively thick epitaxial region 125 supports a relatively high breakdown voltage under reverse bias conditions. For example, an N-type epitaxial layer doping in region 125 of approximately $5 \times 10^{14}$ cm$^{-3}$ and a thickness of about 15 μm can be appropriate for a breakdown voltage of approximately 200 V. The breakdown voltage can be a function of the guard ring geometry and doping level, as is well known.

As is known in the art, a PtSi$_2$ layer, such as used for anode 121 illustrated in FIGS. 1A-1B, can be formed by reacting a deposited Pt metal layer with Si in semiconductor 122 to form a PtSi$_2$ layer. The process of this reaction can consume the Si surface and can drive surface contamination or oxide away from the interface. The PtSi$_2$-to-N-type silicon barrier height is approximately 0.85 eV; different metal silicides with a similar barrier height can also be employed as anode 121.

As noted above, in addition to the PtSi$_2$ anode 121, previously known power Schottky diode 100 can include P-type guard ring 124, which can be defined by doping a first region 124 of semiconductor 122 disposed about the periphery of the Schottky barrier. The guard ring 124 can terminate the edge of the metal-semiconductor Schottky junction where a crowding of the electric field lines under reverse bias occurs. Such a crowding can cause undesirable reverse leakage current and soft breakdown characteristics. Guard ring 124 can spread out the electric field at the edge and provide a suitable breakdown characteristic of a cylindrical PN junction. A typical guard ring of a power Schottky diode can be moderately doped P-type, e.g., with a boron concentration of about $5 \times 10^{17}$ cm$^{-3}$ to a depth of about 2 and can have a resistivity of about 0.05 Ω-cm and a sheet resistance of about 250 Ω/□.

FIG. 1C illustrates an exemplary circuit representation of an exemplary, previously known power Schottky diode. The circuit representation includes the main metal-semiconductor Schottky diode with a PN guard ring junction diode, of relatively smaller area, connected in parallel with the Schottky diode. The PN-junction does not turn on significantly in the forward direction because it is shunted by the Schottky barrier that has a significantly lower forward voltage drop. Therefore there is no significant minority carrier injection from the P-type guard ring into the N-type epitaxial semiconductor region under forward bias, and thus there is no significant minority carrier reverse recovery time when switching the diode off. Fast turn-off is an exemplary advantage of a power Schottky diode as compared with a conventional rectifier diode. For example, relatively fast turnoff can allow for relatively higher switching frequencies (trends are approaching 1 MHz), which in turn can allows for smaller transformer, energy storage inductors, and other magnetics, which can in turn lead to smaller weight.

Referring again to FIG. 1B, another feature of previously known power Schottky diode 100 includes the use of a relatively thin, relatively high quality oxide region 127 to laterally delineate the metal-semiconductor junction, e.g., an oxide material of approximately 200 nm thickness. Note that term "thin" here is used in the relative sense for power devices, whereas in the CMOS realm such thicknesses may be considered to be relatively thick. The relatively thin oxide 127 need not support the full applied reverse voltage, because it is substantially surrounded by anode electrode 130 and by heavily doped P-type guard ring silicon 124 that also can be at the same potential as anode electrode 130. A relatively thick, relatively low quality oxide region 128, such as tetraethylortho silicate (TEOS) oxide can be used to support the full reverse voltage as needed at the far edges of the diode. The top anode contact of the power Schottky diode, e.g., anode electrode 130, can be formed of relatively thick metal, e.g., aluminum (Al), which can provide for ruggedness and bondability. A different metal such as Au could also be used, and is sometimes employed, although much more costly. A refractory metal film or metal alloy film such as Mo, TiW, NiW etc. (singly or in multiple layers), e.g., layer(s) 129b illustrated in FIG. 1B, can also inhibit the Al from "spiking" into the PN junction and causing high leakage. These refractory films, e.g., layer(s) 129b also can aid in adherence of the thick top anode metal.

Contact can be made to the P-type guard ring 124 with the same PtSi$_2$ metal 121 that forms the Schottky barrier on the N-epitaxial material 125. Beneficially, however, PtSi$_2$ anode 121 forms a nearly ohmic contact to P-type silicon because the PtSi$_2$ to P-type silicon barrier height is relatively low (approximately 0.25 eV). The back contact metallization, e.g., cathode electrode 140, as shown in FIG. 1A, but not visible in FIG. 1B, typically can include an evaporated Ti layer followed by Au—Ge alloy or Ni/Au layered metal. The typical area of the Schottky junction might be at least 50×50 mils (2500 sq. mils) for a relatively small diode. The guard ring is typically about 4 mils in peripheral extent around the Schottky contact, producing a PN junction area of about 400 square mils in this example, a relatively small percentage of the Schottky area. As noted above, FIG. 1A and its inset show a relatively correctly scaled cross sectional view of previously known power Schottky diode 100. The die itself can be about 60 mils square, while the Schottky barrier can be about 50 mils square. The edge termination and guard ring are shown approximately to scale in the inset of FIG. 1A.

In space satellites, the power supply is unavoidably exposed to relatively high energy cosmic rays. These rays can include relatively heavy, ionized particles (such as protons and atomic nuclei, which may be collectively referred to herein as "heavy ions") travelling through space at relatively high speeds. Such particles travel from outside the solar system and their origin is unknown. The atmosphere surrounding the earth absorbs virtually all these particles so the terrestrial environment for a power Schottky diode is relatively benign. However in the space environment, these particles are capable of penetrating the skin of the satellite and the casing of the power supply, and can travel through the electronic components themselves, including any power Schottky diodes. If a particle of sufficient energy impinges upon the power Schottky diode while it is in its reverse blocking state, a single event burnout (SEB) can occur.

It is believed that in order for a SEB to occur in a power Schottky diode, a few conditions are simultaneously satisfied. For example, the power Schottky diode can be in its reverse blocking state at the instant that the particle is received; the particle can have a sufficiently high kinetic energy; and the particle can impinge upon the power Schottky diode near the guard ring. SEB tests have been performed on planar power Schottky diodes from many different manufactures. For example, SEB can be simulated in the laboratory using a synchrotron or cyclotron radiation facility to generate a beam of ionized particles. FIG. 2A illustrates a plan view of certain components of an exemplary, previously known power Schottky diode including a SEB damage site caused by a heavy ion strike, e.g., from cosmic rays or as simulated in the laboratory. In FIG. 2A, a top view of Schottky diode 100 is shown with all of the metallization and Schottky metal layers removed, showing the surface of the depletion region 126 of semiconductor 122. It is believed that SEB damage sites typically occur near or at the edge of the guard ring (e.g., ring 124) that is adjacent to the Schottky metal (e.g., anode 121, not shown in FIG. 2A). For example, FIGS. 2B and 2C illustrate images of exemplary, previously known power Schottky diodes including a SEB damage site caused by a heavy ion strike during testing in the laboratory of a power supply (FIG. 2B) or the diode alone (FIG. 2C). It respectively can be seen in FIGS. 2B and 2C that the damage sites 250, 250' appear relatively similar to one another and are both relatively close to the edge of corresponding guard ring 224, 224'. Note that the scratches in FIG. 2C due to die extraction and handling are unrelated to the damage site.

The response of a targeted semiconductor device, e.g., power Schottky diode, can be characterized by its threshold linear energy transfer (LET) value, and its saturated cross section. Both of these parameters are a measure of the susceptibility of the device to heavy ions. For suitable use of a power Schottky diode in a space application, the burnout threshold LET can be relatively high, and the saturated cross section relatively low. For example, as the reverse bias on the power Schottky diode is increased, the threshold LET can become lower, and the saturated cross section can become higher. For suitable use of a power Schottky diode in a space application, the diode can be derated relative to the manufacturer's rating, which can be an undesirable compromise. The reliability of the power supply can be based on the waveform of the switching voltage; for example, if the voltage switching time is sufficiently short, the probability of a burnout can decrease concomitantly. As such, a voltage switching waveform having a DC reverse voltage or having a large reverse duty cycle is not believed to be feasible with previously known power Schottky diodes in space applications. This too can create an undesirable compromise for such devices.

SUMMARY

Embodiments of the present invention provide single-event burnout (SEB) hardened power Schottky diodes, and methods of making and using the same.

Under one aspect of the present invention, a power Schottky diode includes a cathode; a semiconductor disposed over the cathode, the semiconductor including at least a first region and a second region, the second region defining a guard ring; an anode disposed over the first region and at least a portion of the guard ring, the anode including a metal, a junction between the anode and the first region defining a Schottky barrier; and an oxide disposed over the guard ring. Additionally, the power Schottky diode can include a resistive material disposed over at least a portion of the guard ring and at least a portion of the oxide. The resistive material can inhibit a flow of holes from the guard ring to the anode following a heavy ion strike to the guard ring.

In some embodiments, the anode further is disposed over at least a portion of the resistive material. In some embodiments, the anode further is disposed over the entirety of the resistive material.

In some embodiments, the oxide includes a first, relatively high quality and relatively thin oxide material disposed over the guard ring; and a second, relatively low quality and relatively thick oxide material disposed over the first oxide material.

In some embodiments, the resistive material includes polysilicon.

In some embodiments, the power Schottky diode further includes a substrate defining the cathode, the semiconductor being epitaxially disposed over the substrate.

In some embodiments, the second region is doped with a P-type dopant so as to define the guard ring; and a third region of the semiconductor is doped with an N-type dopant.

In some embodiments, the power Schottky diode further includes an electrode disposed over the resistive material.

Under another aspect of the present invention, a method of forming a power Schottky diode includes providing a cathode; providing a semiconductor disposed over the cathode, the semiconductor including at least a first region and a second region, the second region defining a guard ring; providing an anode disposed over the first region and at least a portion of the guard ring, a junction between the anode and the first region defining a Schottky barrier; and providing an oxide disposed over the guard ring. The method further can include disposing a resistive material over at least a portion of the guard ring and at least a portion of the oxide. The resistive material can inhibit a flow of holes from the guard ring to the anode following a heavy ion strike to the guard ring.

Under yet another aspect of the present invention, a method includes providing a power Schottky diode. The power Schottky diode can include a cathode; a semiconductor disposed over the cathode, the semiconductor including at least a first region and a second region, the second region defining a guard ring; an anode disposed over the first region and at least a portion of the guard ring, the anode including a metal, a junction between the anode and the first defining a Schottky barrier; and an oxide disposed over the guard ring. The power Schottky diode further can include a resistive material disposed over at least a portion of the guard ring and at least a portion of the oxide. The method further can include inhibiting by the resistive material a flow of holes from the guard ring to the anode following a heavy ion strike to the guard ring.

DETAILED DESCRIPTION

Figure 1A:
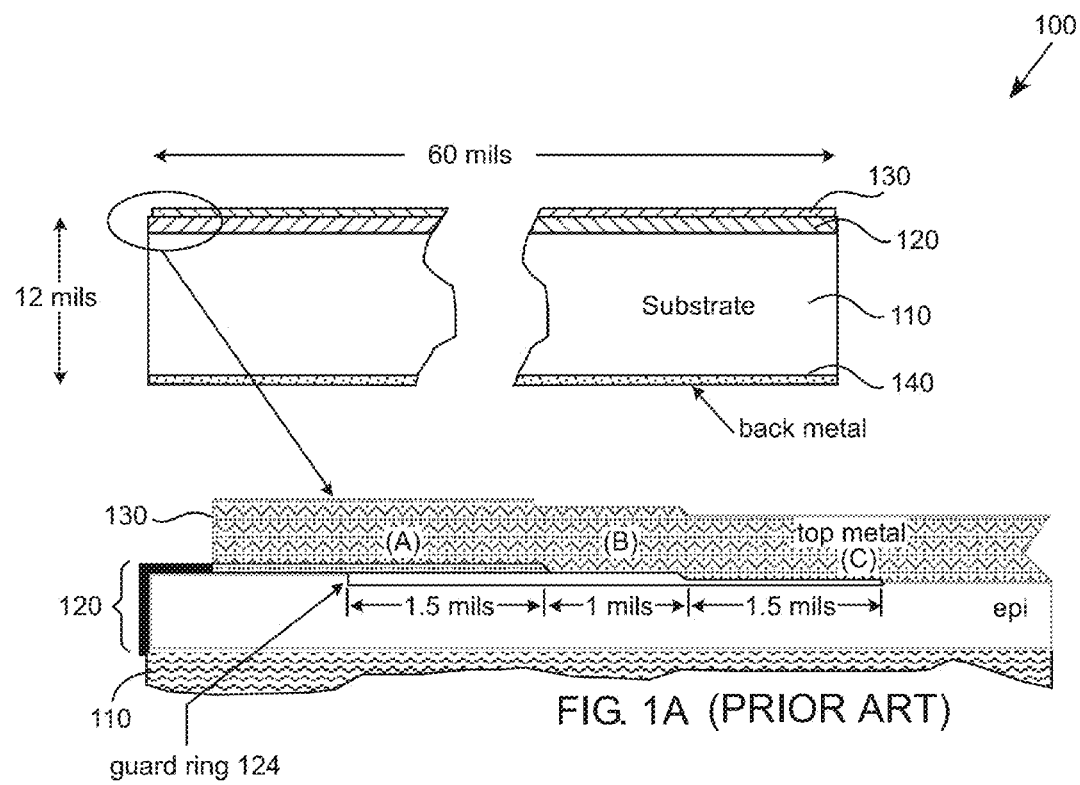
FIGS. 1A-1B illustrate cross sections of an exemplary, previously known power Schottky diode.

Embodiments of the present invention provide single-event burnout (SEB) hardened power Schottky diodes, and methods of making and using the same. By "SEB hardened," it is meant that the power Schottky diodes have reduced vulnerability to SEB that otherwise can result from exposure to, or contact with, heavy ions, such as from cosmic rays in a space application. For example, such as discussed above, previously known power Schottky diodes for use in switching power supplies or converters in space applications, such as in satellites and space vehicles, can have a major weakness when exposed to charged cosmic ray particles. Additionally, as discussed above, SEBs are often observed in power Schottky diodes that are under reverse voltage when exposed to, or contact with, heavy ions, and thus SEBs can have a characteristic location at the edge of the guard ring, and can result in catastrophic failure of the power Schottky diode. In comparison, the present power Schottky diodes can be hardened against SEB by including an integrally formed protection resistor that includes a relatively resistive material, e.g., a material that impedes the flow of electrical current, e.g., has a resistivity in the range of approximately 100 to 1000 Ω-cm, or greater than 1000 Ω-cm. For example, the present power Schottky diodes can include a protective resistive ring, which is believed potentially can reduce or even eliminate vulnerability of the present power Schottky diodes to SEB. As such, the present power Schottky diodes potentially suitably can be used in environments where the diodes are likely to be exposed to, or contacted with, heavy ions, with significantly reduced risk of failure from SEB.

Additionally, the present resistive material readily can be integrated into the existing fabrication process for planar power Schottky diodes. For example, as discussed above with reference to FIGS. 1A-1B, previously known power Schottky diodes can utilize a metal-semiconductor contact to define a Schottky barrier, e.g., contact between anode 121 and semiconductor 122. For example, anode 121 can be implemented as a metal silicide formed by reacting a pure metal atop a lightly doped N-type epitaxial layer disposed on a substrate, e.g., silicon wafer. The edges of the contact can be surrounded by a P-type guard ring, e.g., guard ring 124, so as to terminate or spread out the high electric field concentration at the edge of the contact under large reverse bias, and thus to reduce the leakage current and allow for relatively high reverse operating voltage. However, without wishing to be bound by any theory, it is believed that the SEB vulnerability of previously known power Schottky diodes may reside in the interaction of the guard ring with the lightly doped Schottky diode cathode. In the present SEB hardened power Schottky diodes, an integrated resistor can be formed in series with the guard ring PN junction anode so as to reduce or eliminate this SEB mode.

As noted further above, there are believed to be hundreds if not thousands of previously known power Schottky diodes in space applications, e.g., satellite and space vehicle power supplies, and power conditioners, both flying and planned. However, such power Schottky diodes have a known SEB vulnerability; as such, extensive testing at both the diode part level and at the power supply box level typically is performed before the power Schottky diode can be deployed. For example, SEB statistics can be gathered so as to evaluate the probability of power Schottky diode failure caused by SEB during use. For example, the switching waveforms to be used under various power supply loads can be applied to the power Schottky diode, while testing that diode in a particle beam radiation facility. Extensive statistical calculations and curve fitting can be used to qualify a power unit for use. Such time consuming and costly tasks presently are a part of many, or even most, high reliability satellite and space programs. Accordingly, it is believed that power Schottky diode manufacturers, the manufactures of flight power units including power Schottky diodes, and contractors using power Schottky diodes or flight power units including such diodes, potentially can greatly benefit from reducing some of this effort. The present SEB hardened power Schottky diodes are believed to reduce or eliminate SEB, and thus potentially to reduce the level of testing and analysis needed. For example, the present SEB hardened power Schottky diodes potentially can make power supply testing for space applications more routine, and potentially can save many man hours that otherwise may be expended upon such testing.

First, a proposed mechanism for SEB caused by a heavy ion strike to an exemplary, previously known power Schottky diode is discussed. Then, an exemplary embodiment of the present SEB hardened power Schottky diode will be discussed, as well as exemplary methods of making and using the same.

Single-Event Burnout Phenomena in Previously Known Power Schottky Diodes

Figure 2A:
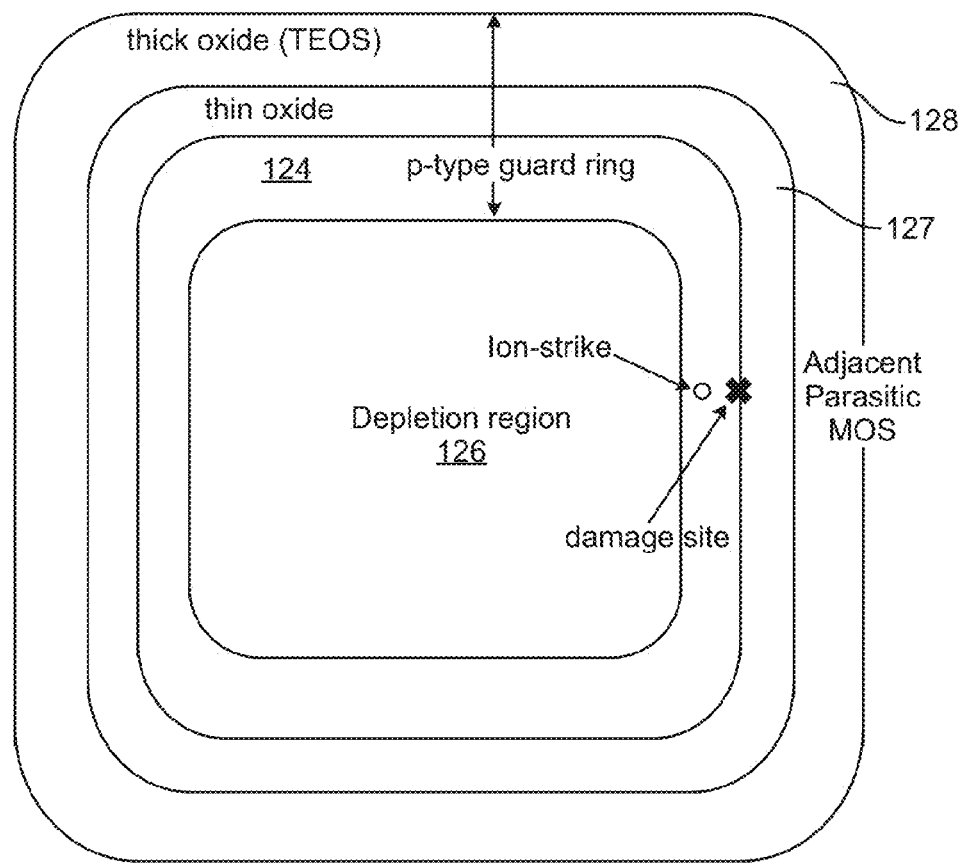
FIG. 2A illustrates a plan view of certain components of an exemplary, previously known power Schottky diode including a single-event burnout (SEB) damage site caused by a heavy ion strike. The figure shows the surface remaining after all metals and metal silicides are imagined to be removed, leaving behind the silicon and oxide surfaces only.
Figure 2B:
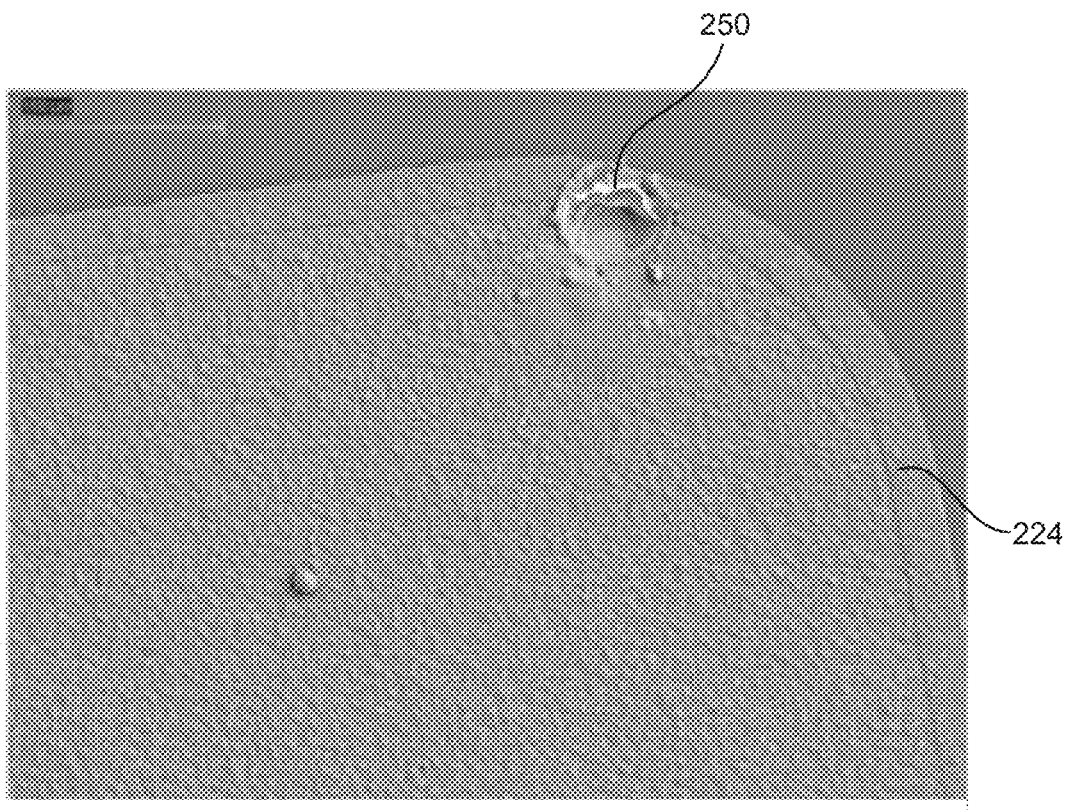
FIGS. 2B-2C illustrate images of exemplary, previously known power Schottky diodes including a SEB damage site caused by a heavy ion strike.
Figure 2C:
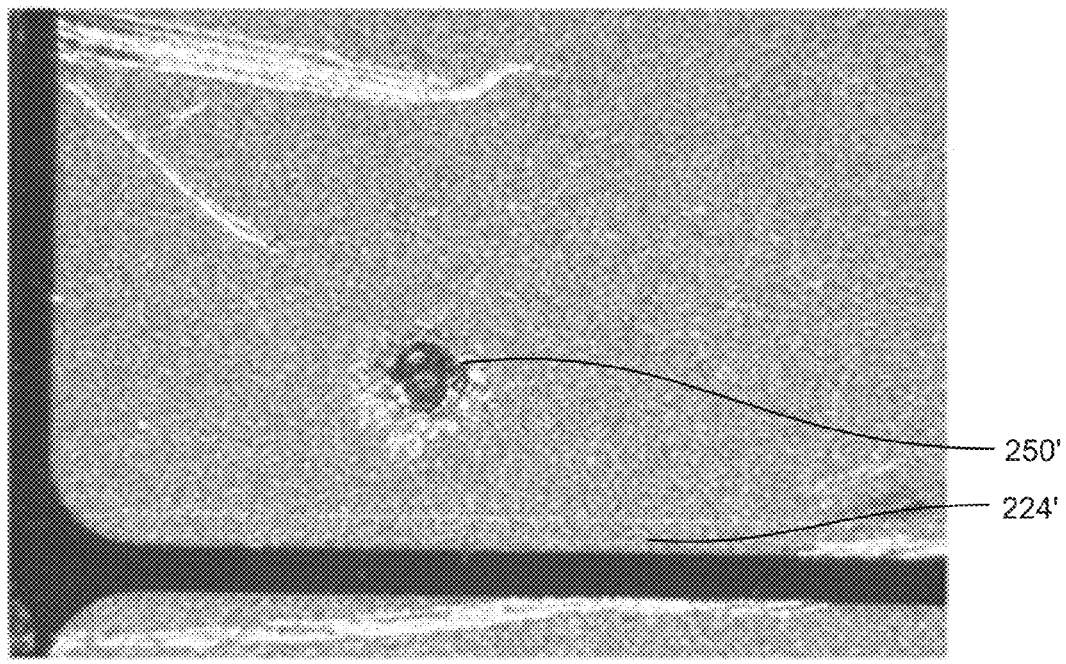

SEB damage sites in previously known power Schottky diodes, such as described above with reference to FIGS. 2A-2C, are believed to show evidence of a permanently melted-through region of the silicon, typically near the edge of the guard ring, that results in a shorted-out diode. This phenomenon has been noted in many planar Schottky power diodes from different manufacturers. For further details, see the following references, the entire contents of each of which are incorporated by reference herein: Ralston-Good, "Analysis of Schottky Diode Failure Mechanisms During Exposure to Electron Beam Pulse using TCAD Simulation," Master's Thesis, Vanderbilt University, Nashville, Tenn. (2002); Gigliuto et al., "Observed Diode Failures in DC-DC Converters," NASA-NEPP Electronic Technology Workshop (Jun. 11-13, 2012); and George et al., "Single Event Burnout Observed in Schottky diodes," IEEE Radiation Effects Data Workshop, pages 1-8 (2013). However, it is believed that heretofore, there has been no satisfactory explanation of the preference for the damage site to be located at the edge of the guard ring. For example, simulations have been performed with semiconductor device codes such as the Atlas Device Simulation Network (Silvaco, Inc., Santa Clara, Calif.), but such simulations have not been discerning enough to distinguish between the particular portion of the guard ring at which the SEB damage typically is observed, and the remainder of the guard ring or even over the main Schottky diode. The simulations appear to suggest that an electrothermal coupling effect exacerbates the problem, and that the burnout occurs more readily at higher reverse biases where the heavy ion triggers a premature avalanche breakdown. These phenomena have been previously known to cause SEB in conventional high voltage PN-junction diode rectifiers. For further details, see the following references, the entire contents of each of which are incorporated by reference herein: Soelkner et al., "Charge Carrier Avalanche Multiplication in High-Voltage Diodes Triggered by Ionizing Radiation," IEEE Transactions on Nuclear Science 47-6: 2365 (2000); Albadri et al., "Single Event Burnout in Power Diodes: Mechanisms and Models," Microelectronics Reliability, 46: 317-325 (2006); Albadri et al., "Coupled Electro-Thermal Simulations of Single Event Burnout in Power Diodes," IEEE Transactions on Nuclear Science 52-6: 2199 (2005); and Mahajan, "Electro-Thermal Simulation Studies of Single-Event Burnout in Power Diodes," Master's Thesis, Vanderbilt University, Nashville, Tenn. (2006).

However, it is believed that studies such as mentioned above do not satisfactorily explain why a Schottky diode should behave differently than a conventional PN-junction upon exposure to, or contact with, a heavy ion. Although SEB infrequently occurs in the main Schottky portion of previously known power Schottky diodes, the relatively greater prevalence of failures at the guard ring edge is believed to remain unexplained heretofore. For example, in some respects, SEB damage resembles that of SEGR (single event gate rupture) in power MOSFETs; however, previously known power Schottky diodes do not include an NPN parasitic bipolar transistor that can be triggered by exposure to, or contact with, a heavy ion, as is the case with power MOSFETS.

Figure 3:
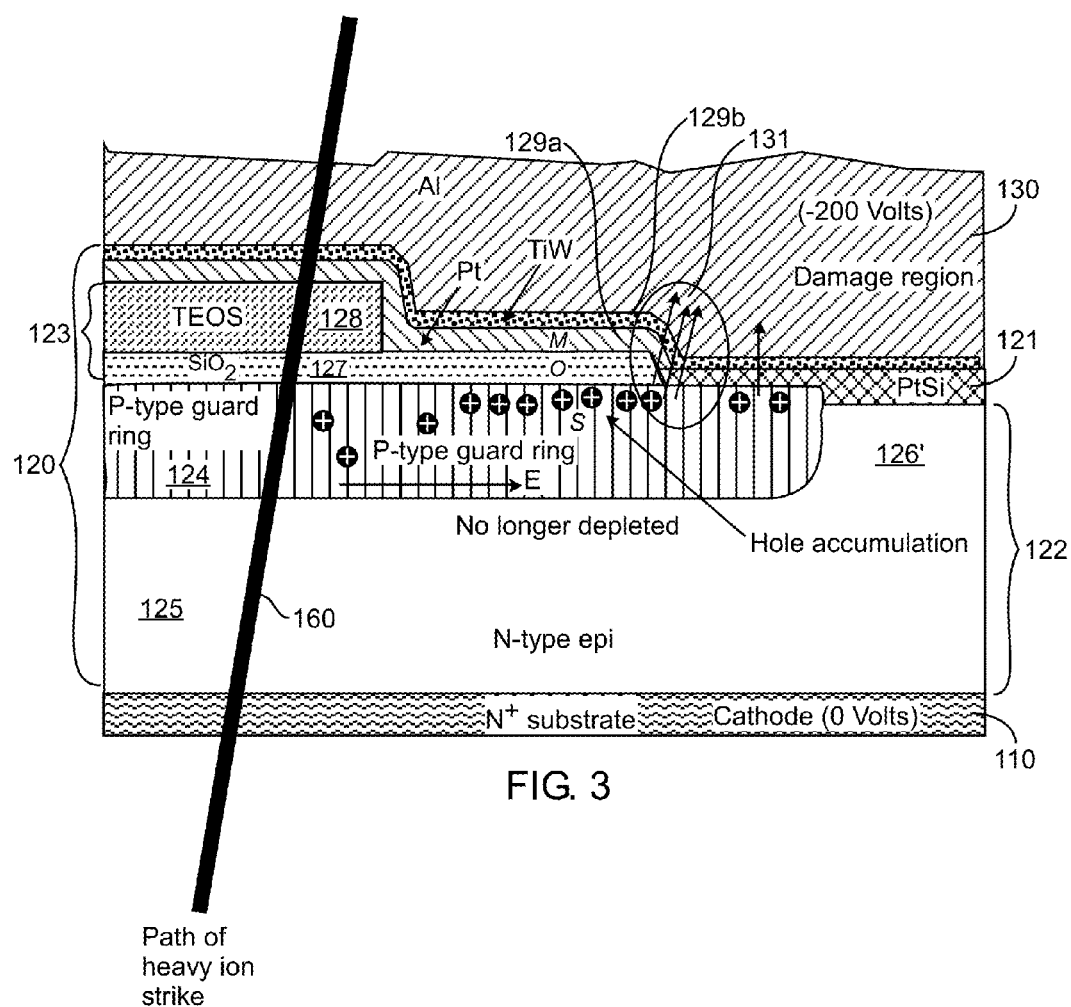
FIG. 3 illustrates an exemplary mechanism for generation in a previously known power Schottky diode of a SEB damage site caused by a heavy ion strike, according to some embodiments of the present invention.

Without wishing to be bound by any theory, FIG. 3 illustrates an exemplary mechanism for generation in a previously known power Schottky diode of a SEB damage site caused by a heavy ion strike, according to some embodiments of the present invention. The power Schottky diode 100 can have a construction analogous to that described above with reference to FIGS. 1A-1C, e.g., can include substrate 110, active region 120, anode electrode 130, and cathode electrode 140 (not shown in FIG. 3) that can be constructed analogously as described above with reference to FIGS. 1A-1C. FIG. 3 illustrates a proposed mechanism for response of the previously known power Schottky diode 100 to a heavy ion strike to guard ring region 124 of under reverse bias, in which top electrode 130 is, for example, at −200 V, while cathode (substrate) 110 is at ground potential (0 V), corresponding to a typical reverse bias voltage for space applications. Without wishing to be bound by any theory, it is believed that the heavy ion strike creates plasma 160 of holes and electrons within at least semiconductor 122, and potentially also extending into substrate 110. Without wishing to be bound by any theory, it is believed that such plasma 160 of holes and electrons potentially can short P-type guard ring 124 to the same voltage as substrate 110, e.g., to ground, for a few nanoseconds, which is believed to be sufficient time for a series of events to occur that potentially can cause SEB. For example, without wishing to be bound by any theory, FIG. 3 illustrates four regions that are believed to potentially be relevant to SEB. Starting from the left side of FIG. 3, within a first region, anode electrode 130 can be disposed over relatively thick oxide 128, which in turn can be disposed over guard ring 124. Based on the exemplary voltage of −200 V applied to anode electrode 130, the electric field through relatively thick oxide 128 is about 2 MV/cm, well below the breakdown field of typical oxides.

Still referring to FIG. 3, within a second region to the right of the first region, anode electrode 130 can be disposed over relatively thin oxide 127, which in turn can be disposed over guard ring 124. Here, relatively thin oxide 127 can be relatively thinner than is relatively thick oxide 128, and in the present example must withstand a field of about 10 MV/cm, which is relatively high. Without wishing to be bound by any theory, it is believed that the time duration of the event is relatively short, and that therefore time dependent dielectric breakdown of relatively thin oxide 127 does not immediately occur. However, without wishing to be bound by any theory, it is believed that under the transient state immediately following generation of plasma 160, the structure defined by anode electrode 130, relatively thin oxide 127, and guard ring 124 structure resembles a MOS capacitor under relatively strong accumulation conditions. Without wishing to be bound by any theory, it is believed that holes (majority carriers, represented in FIG. 3 by "+") in guard ring 124 potentially may be suddenly attracted to the lower surface of relatively thin oxide 127, and that such surface accumulated charge density can become relatively high.

Still referring to FIG. 3, within a third region to the right of the second region, anode 121 can be disposed over guard ring 124. In this example, because of the relatively low barrier height of $PtSi_2$ to P-type silicon, the metal-semiconductor contact between anode 121 and guard ring 124 can be relatively ohmic. However, guard ring 124 may be only moderately doped, such that the specific contact resistance between anode 121 and guard ring 124 can be approximately $10^{-3}$ to $10^{-2}$ $\Omega$-$cm^2$ for this level of P-type doping. For further details regarding analogous contact resistances, see the following reference, the entire contents of which are incorporated by reference herein: Stavitski et al., "Systematic TLM Measurements of NiSi and PtSi Specific Contact Resistance to n- and p-Type Si in a Broad Doping Range," IEEE Electron Device Letters 29-4: 378 (2008).

Figure 1B:
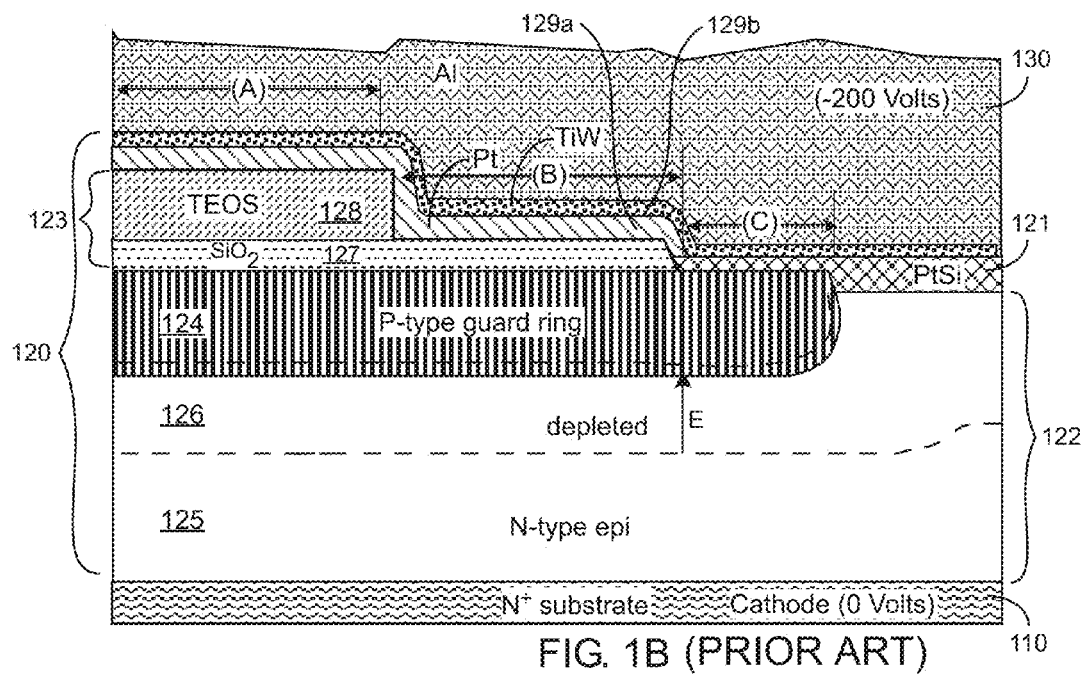
Figure 1C:
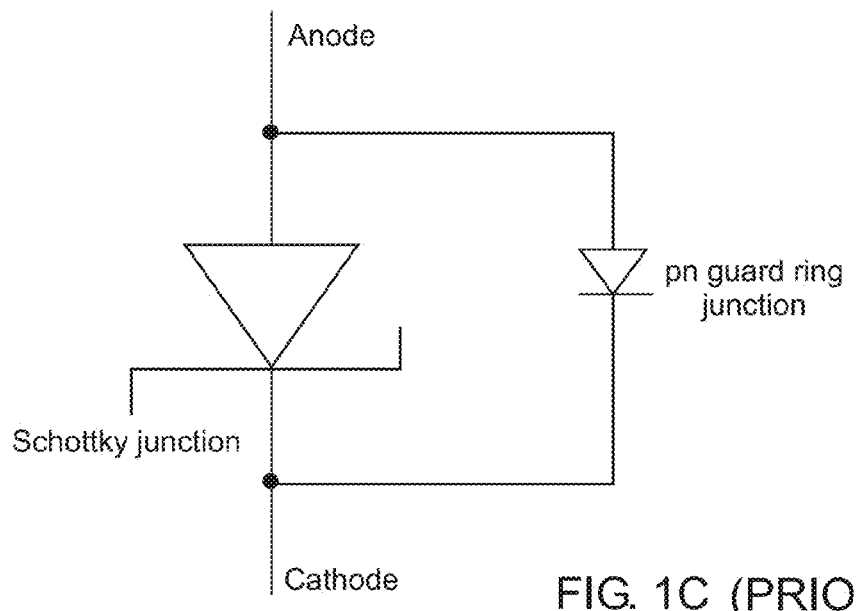
FIG. 1C illustrates an exemplary circuit representation of an exemplary, previously known power Schottky diode.

Still referring to FIG. 3, within a fourth region to the right of the third region, anode 121 can be disposed over region 126' of semiconductor 122 that formerly was depleted. Under normal reverse bias conditions, the leakage current is dominated by minority carrier generation in depletion region 126 under the Schottky barrier, as is illustrated in FIGS. 1A-1B. Normally, any holes thermally generated in this area are swept toward the reverse-biased Schottky junction where they are collected. Without wishing to be bound by any theory, it is believed that under the conditions brought about by a heavy ion strike in the guard ring area, holes accumulated at the MOS capacitor-like structure defined by anode electrode 130, relatively thin oxide 127, and guard ring 124 can also be injected into the N-type Schottky barrier region based upon those holes overcoming the PN-junction built-in potential.

Additionally, without wishing to be bound by any theory, it is believed that the damage region resulting from SEB in power Schottky diodes typically occurs at the thin oxide edge of the guard ring because, immediately after the heavy ion strike, the accumulation layer of holes can drastically lower the sheet resistance of guard ring 124 under relatively thin oxide 127. Without wishing to be bound by any theory, it is believed that the path of least resistance for the accumulated holes to reach the negative anode 121 is at the high current spot region 131 illustrated in FIG. 3, corresponding to the right-most edge of contact between relatively thin oxide 127 and guard ring 124. Without wishing to be bound by any theory, it is believed that the current density is relatively high at that edge because the hole density is relatively high at that edge, e.g., as compared to the region over which guard ring 124 and anode 121 contact one another, at which it is believed that there is no significant accumulation of holes, and which can be characterized by the sheet resistance of guard ring 124 plus the contact resistance between guard ring 124 and anode 121.

For example, although an exemplary guard ring 124 can include a doping level of about $5 \times 10^{17}$ cm$^{-3}$ and the specific contact resistance between guard ring 124 and a platinum silicide based anode layer 121 can be about $10^{-3}$ to $10^{-2}$ $\Omega$-cm$^2$, it is believed that the layer of accumulated holes near or at the interface between guard ring 124 and relatively thin oxide 127 can have a hole density of at least $10^{20}$ cm$^{-3}$. The specific contact resistance between guard ring 124 and anode 121 for such a hole concentration can be significantly lower than that of between guard ring 124 and a platinum silicide based anode 121 in the absence of such a hole concentration, e.g., can be lower by approximately six orders of magnitude. For example, without wishing to be bound by any theory, it is believed that at the rightmost edge of relatively thin oxide 127, such a high hole density potentially can lower the specific contact resistance between guard ring 124 and a platinum silicide based anode 121, e.g., to approximately $10^{-9}$ $\Omega$-cm$^2$.

Without wishing to be bound by any theory, it is believed that such a relatively low contact resistance potentially can concentrate the current density at the edge of relatively thin oxide 127 at a region nearest to the particle strike. Without wishing to be bound by any theory, it is believed that such a relatively high spot current density, if allowed to flow for sufficient time is capable of causing damage by localized melting of one or more of relatively thin oxide 127, semiconductor 122, anode 121, and anode electrode 130. Additionally, without wishing to be bound by any theory, it is believed that a relatively high hole density is created at the MOS capacitor accumulation layer because of the large reverse voltage that is suddenly imposed onto the MOS capacitor-like structure defined by anode electrode 130, relatively thin oxide 127, and guard ring 124. For example, free holes that are majority carriers in guard ring 124 potentially can be attracted to the interface between guard ring 124 and relatively thin oxide 127, thus creating relatively high hole density.

Additionally, without wishing to be bound by any theory, it is believed that the current in N-type epitaxial region 125, e.g., lightly doped N-type epitaxial silicon, potentially can exacerbate the damage. For example, without wishing to be bound by any theory, it is believed that after the heavy ion strike, the resulting plasma of holes and electrons in N-type epitaxial region 125 can drift under the applied reverse bias, and the electric fields can be modified so as to satisfy Poisson's equation and drive the holes of the plasma into the aforementioned small high current spot at guard ring 124. Without wishing to be bound by any theory, it is believed that the electrons of the plasma can drift downward to substrate 110. Without wishing to be bound by any theory, it is believed that the plasma potentially can broaden laterally and shrink vertically, and can exist for about 15-20 nanoseconds before it dissipates, depending upon the applied voltage, epitaxial layer thickness, and the ion LET, in a manner analogous to that described in Laird et al., "Relaxation of High-Energy Heavy-Ion Induced Bipolar Plasmas in Si Epilayer Devices as a Function of Temperature," Journal of Applied Physics 104: 084510-1 (2008), the entire contents of which are incorporated by reference herein. Without wishing to be bound by any theory, it is believed that based upon there being a sufficiently high voltage across epitaxial region 125, avalanche generation or avalanche injection can be initiated, that can tend to sustain the current that feeds the guard ring 124 current spot. Without wishing to be bound by any theory, it is believed that based upon a current being sustained for a sufficient time, a melt can form at the high current spot, resulting in damage.

Without wishing to be bound by any theory, it is believed that a relatively low doping density of epitaxial layer 125 potentially can exacerbate SEB. In the exemplary power Schottky diode illustrated in FIG. 3, the doping can be about $5 \times 10^{14}$ cm$^{-3}$, and thus have an intrinsic temperature of about 230° C. Without wishing to be bound by any theory, it is believed that at the intrinsic temperature, the density of thermally generated carriers potentially can exceed the doping density; a runaway or negative resistance electrothermal effect potentially can occur where the thermally generated carriers conduct more current density, heating the local plasma column further, generating yet more carriers in an infinite loop. Without wishing to be bound by any theory, it is believed that such exacerbating factors potentially can lengthen the duration of the plasma column, and potentially can promote damage at the high current spot region 131.

Without wishing to be bound by any theory, it is believed that based upon the current persisting for a sufficient time at the high current spot region 131, e.g., for a few tenths of microseconds, or for longer, the local temperature potentially can rise to the melting temperature of silicon (1414° C.) or of PtSi$_2$ (1229° C.), thus causing a SEB damage site.

Without wishing to be bound by any theory, it is believed that, in comparison, based upon the ion strike occurring in the Schottky diode region defined by depletion layer 126 and anode 121 and at a spaced distance from guard ring 124, there can be a significantly lower chance of damage from SEB. For example, without wishing to be bound by any theory, it is believed that in the Schottky diode region there is no MOS capacitor structure that can produce a hole accumulation layer. Further, the silicon under the Schottky diode region is N-type and therefore holes are minority carriers and relatively few in number, especially when the depletion layer exists under reverse bias. Without wishing to be bound by any theory, it is believed that the relatively small numbers of holes that potentially can be created by the particle strike can be collected by the Schottky diode region fairly harmlessly. However, based upon the reverse voltage being sufficiently high to produce avalanching in the substrate or if the temperature is close to the intrinsic temperature of the substrate, damage potentially can also occur in the Schottky diode region. For example, it has been observed in SEB testing that when the Schottky diode region fails, there does not appear to be a crater site or evidence of a melting event, but rather the damage site is usually invisible and can be observable by cross sectioning or by IR thermography, in contrast to the significantly greater severe damage site at the guard ring edge.

Resistive Materials for Hardening Against SEB

Without wishing to be bound by any theory, it is believed that SEB at or near the edge of a guard ring potentially can be reduced or eliminated by limiting current density at or near that edge, e.g., by inhibiting the flow of holes from the guard ring to the anode following a heavy ion strike to the guard ring. In some embodiments of the present invention, the current density can be limited at this edge by adding a protective resistive layer disposed over at least a portion of the guard ring and at least a portion of the oxide disposed over that guard ring. In some embodiments, the resistive material of choice is polysilicon (polycrystalline silicon), which is relatively compatible with standard semiconductor processing and has a resistivity that can be tailored over a relatively wide range.

Figure 4A:
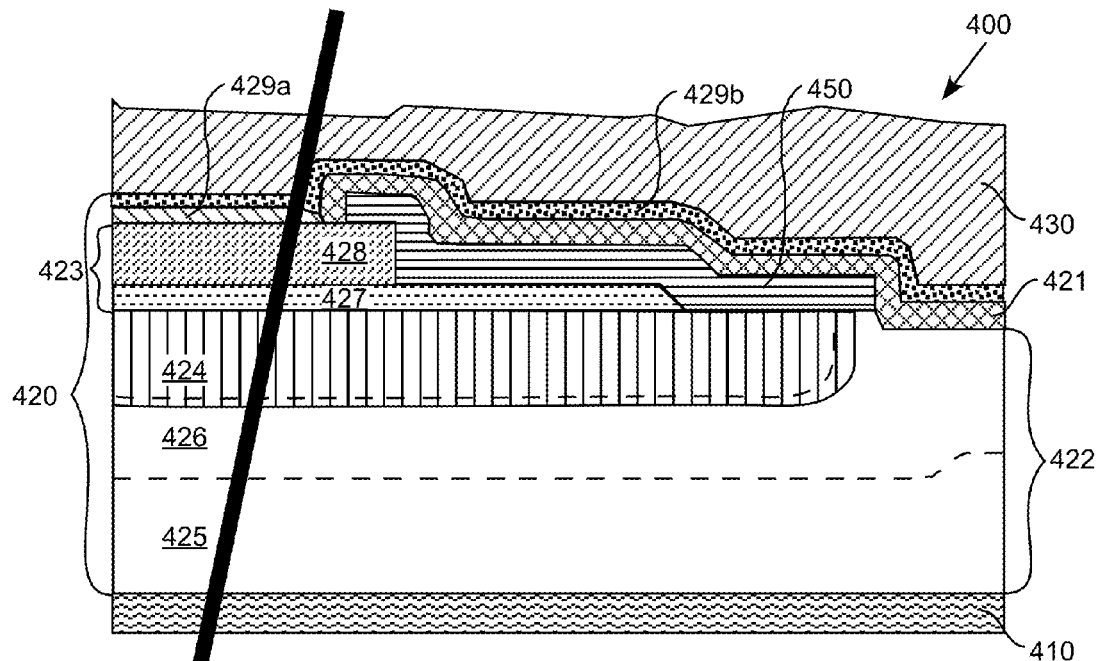
FIG. 4A illustrates a cross section of a SEB hardened power Schottky diode, according to some embodiments of the present invention.
Figure 4B:
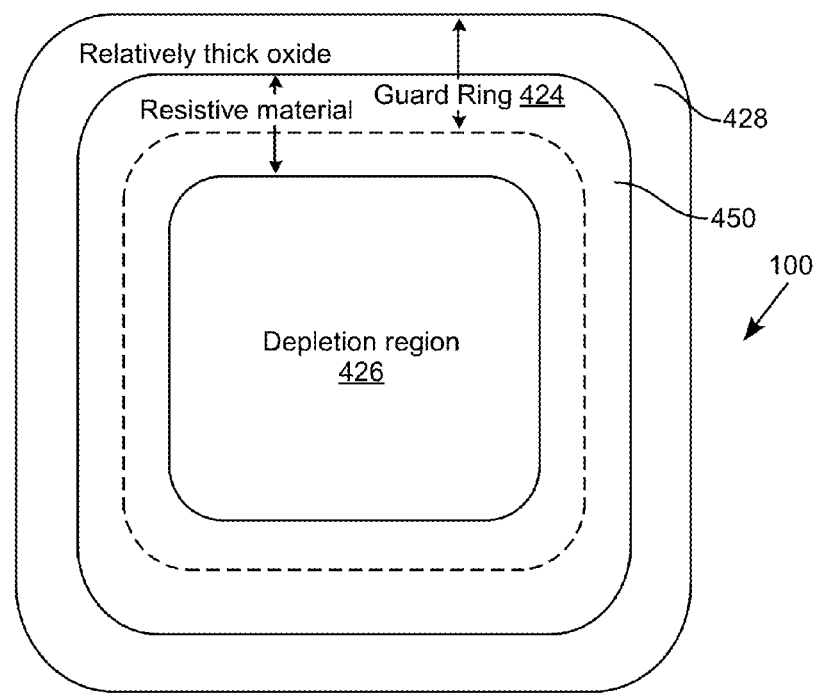
FIG. 4B illustrates a plan view of certain components of a SEB hardened power Schottky diode, according to some embodiments of the present invention. The figure shows the surface remaining after all metals and metal silicides are imagined to be removed, leaving behind the silicon, polysilicon resistive material, and oxide surfaces only. The thin oxide is not shown since it is covered by the polysilicon resistive material.

For example, FIG. 4A illustrates a cross section of a SEB hardened power Schottky diode, and FIG. 4B illustrates a plan view of certain components of a SEB hardened power Schottky diode, according to some embodiments of the present invention.

As illustrated in FIGS. 4A-4B, SEB hardened power Schottky diode 400 includes substrate 410, active region 420, anode electrode 430 (which also may be referred to as a "top metal"), resistive material 450, and a cathode electrode (which also may be referred to as a "back metal", not specifically illustrated in FIGS. 4A-4B). Active region 420 can be disposed over a first surface of substrate 410, anode electrode 430 can be disposed over active region 420, and the cathode electrode can be disposed on a second surface of substrate 410 that is opposite to the first surface in a manner analogous to cathode electrode 140 described above with reference to FIGS. 1A-1B. Substrate 410 can include any suitable semiconductive material, such as silicon. Additionally, anode electrode 430 can include any suitable conductive material or combination of materials, and optionally can include or be disposed over one or more adhesion layer(s) 429b for facilitating durable contact between anode electrode 430 and other components of SEB hardened power Schottky diode 400, and for inhibiting "spiking" of metal from anode electrode 430 into epitaxial layer 422 or into guard ring 424. For example, anode 421 defining the Schottky barrier can include any of a number of elemental metals, such as Pt, Pd, Ti, Co, Cr, Ni, W, Mo or Ta. Such metal also can be deposited in region 429a. When this metal is contacting the surface of substrate 410 or resistive material 450, it reacts with that material, e.g., silicon, as part of the device processing and forms a metal silicide that forms the Schottky barrier metal and the anode of the diode, 421, such as $PtSi_2$, $Pd_2Si$, $TiSi_2$, $Co_2Si$, $CoSi$, $CoSi_2$, $CrSi_2$, $NiSi$, $NiSi_2$, $WSi_2$, $MoSi_2$, or $TaSi_2$. The anti-spiking (adhesion) metal layer 429b can include, for example, a refractory metal such as Mo, W, Ta, Ti, or V, or refractory metal alloy such as TiW, TaN, or TiN. The top anode electrode 430 can include, for example, Al, Au, Cu, or Ag. Exemplary power Schottky diode 400 and components thereof can have dimensions analogous to those described above with reference to FIGS. 1A-1B.

As illustrated in FIG. 4A, active region 420 can include anode 421, semiconductor 422, one or more oxide(s) 423, and resistive material 450. The portion of substrate 410 upon which active region 420 is disposed can be doped, e.g., $N^+$ doped, so as to define a cathode, which can be at substantially the same voltage as is the cathode electrode. Semiconductor 422 can be disposed over the first surface of substrate 410, and can include a crystalline or other suitable semiconductor material, such as epitaxially grown silicon. Different regions of semiconductor 422 can be doped differently than one another. For example, a first region 425 of semiconductor 422 can include lightly doped N-type during epitaxial deposition as described above with reference to FIGS. 1A-1B; a second region 424 of semiconductor 422 can be doped P-type so as to define guard ring 424 analogous to guard ring 124 described above with reference to FIGS. 1A-1B and 2A, e.g., a P-type guard ring; and a third region 425 can be analogous to region 125 described above with reference to FIGS. 1A-1B. In FIG. 4A, region 426 (enclosed by the dashed lines) arises from regions 424 and 425 and is known as the depletion layer. It is formed electrically when the top metal or anode region 420 is biased negatively (for example at −200V) with respect to the cathode or substrate region 410 (for example at 0V).

In SEB hardened power Schottky diode 400 illustrated in FIGS. 4A-4B, anode 421 is disposed over first region 426 and at least a portion of guard ring 424. Anode 421 can include any suitable conductive material, such as platinum silicide ($PtSi_2$), palladium silicide ($Pd_2Si$), titanium silicide ($TiSi_2$), cobalt silicide ($Co_2Si$, $CoSi$, or $CoSi_2$), chromium silicide, $CrSi_2$, nickel silicide ($NiSi$ or $NiSi_2$), tungsten silicide ($WSi_2$), molybdenum silicide ($MoSi_2$), or tantalum silicide ($TaSi_2$). Anode 421 can be at substantially the same voltage as is anode electrode 430, which is disposed over anode 421. For example, anode 421 can be at a voltage of −200 volts, and cathode contact (substrate) 410 can be at a voltage of 0 volts. A junction between anode 421 and semiconductor 422 can define a Schottky barrier in a manner well known in the art. The guard ring can reduce the electrical field gradient at the edge of the Schottky barrier in a manner well known in the art.

Oxide(s) 423 can include one or more discrete layers of oxide material and can be constructed analogously to oxide(s) 123 described above with reference to FIGS. 1A-1B and 2A, e.g., can be disposed over guard ring 424. For example, oxide(s) 423 can include a first, relatively high quality and relatively thin oxide material 427 disposed over guard ring 424, and can include a second, relatively low quality and relatively thick oxide material 428 disposed over first oxide material 427. Illustratively, first oxide material 427 can include (or can consist essentially of) silicon dioxide ($SiO_2$), and second oxide material 428 can include (or can consist essentially of) tetraethyl ortho silicate (TEOS) or a SOG (spin-on glass) such as commercially available from, e.g., Honeywell Electronic Materials (Sunnyvale, Calif.), Futurrex, Inc. (Franklin, N.J.), Desert Silicon, Inc. (Tempe, Ariz.), Dow Corning Corporation (Midland, Mich.), or Filmtronics (Butler, Pa.).

Figure 4C:
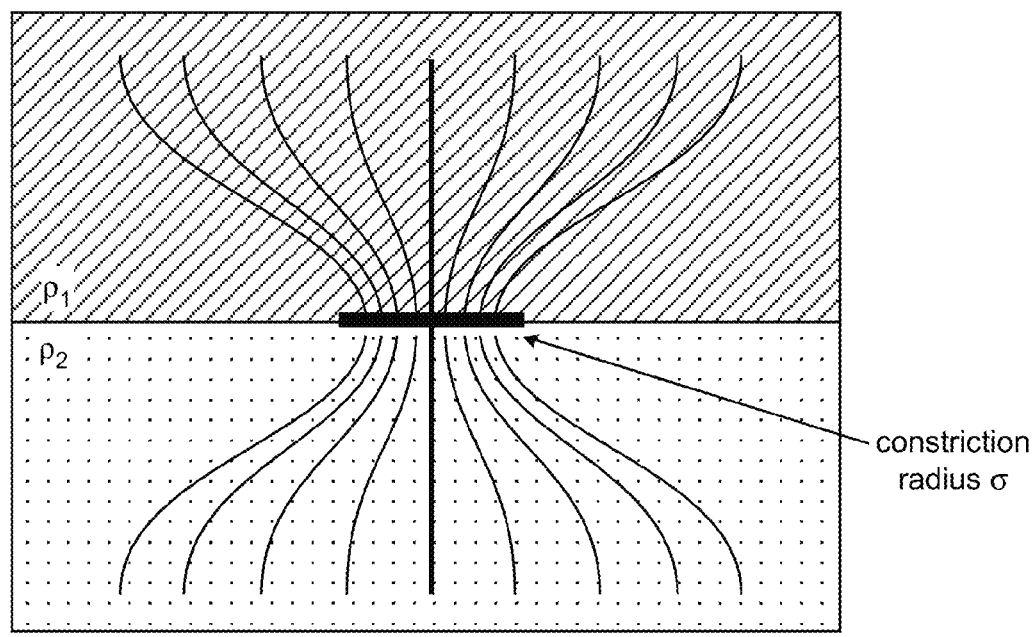
FIG. 4C illustrates an exemplary flow of charge carriers through a constriction, according to some embodiments of the present invention.
Figure 4D:
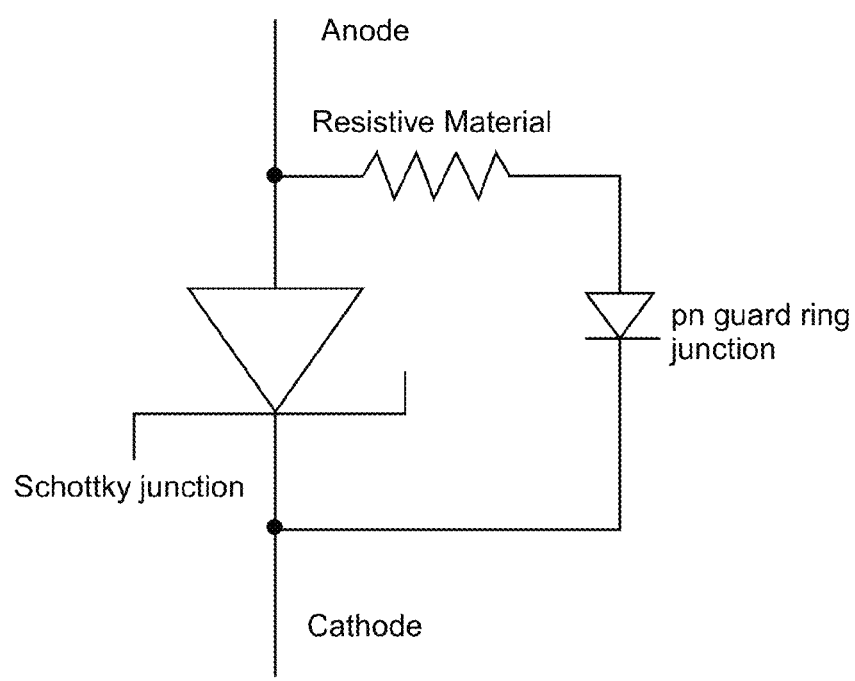
FIG. 4D illustrates an exemplary circuit representation of a SEB hardened power Schottky diode, according to some embodiments of the present invention.

Additionally, in the embodiment illustrated in FIGS. 4A-4B, SEB hardened power Schottky diode 400 includes resistive material 450 disposed over at least a portion of guard ring 424 and at least a portion of oxide(s) 423. Without wishing to be bound by any theory, it is believed that resistive material 450 can inhibit a flow of holes from guard ring 424 to anode 421 following a heavy ion strike to guard ring 424. Illustratively, resistive material 450 can include polysilicon, e.g., polysilicon that can be doped P-type with boron analogously as can be guard ring 424 such that resistive material 450 can form an ohmic contact to guard ring 424. Such ohmic contact between resistive material 450 and guard ring 424 potentially can support leakage current thermally generated by the depletion region 426 that arises from the guard ring 424-to-epi 425 junction under reverse bias. Other exemplary materials that can be included in resistive material include, but are not limited to, nickel chromium (NiCr), tamelox (commercially available from Vishay Americas, Shelton, Conn.), Sichrome, or tantalum nitride (TaN). In some embodiments, resistive material 450 can be extended slightly into the Schottky diode region 421, 426 where resistive material 450 can form a P (resistive material)-to-N (epitaxial silicon) junction in parallel with the Schottky diode region. With such an arrangement, the anode silicide-to-P-guard ring interface can be considered to be replaced by the resistive material-to-P-guard ring interface in parallel with the Schottky contact in a previously known power Schottky diode. For example, FIG. 4D illustrates an exemplary circuit representation of a SEB hardened power Schottky diode, according to some embodiments of the present invention. It may be seen in FIG. 4D that the resistive material may be considered to be connected in series with the PN guard ring junction, and the series combination of guard ring and resistive material in parallel with the Schottky junction.

Additionally, in the embodiment illustrated in FIGS. 4A-4B, resistive material 450 also can be disposed over at least a portion of relatively thin oxide 427 and at least a portion of relatively thick oxide 428. The metal gate MOS structure described above with reference to FIGS. 1A-1B therefore can be replaced with a MOS structure that includes, from top to bottom, metal-polysilicon (or other resistive material)-relatively thin oxide-silicon. Based upon a particle strike occurring, the P-type guard ring still can be brought close to ground potential. However, without wishing to be bound by any theory, it is believed that the arrangement illustrated in FIGS. 4A-4B may inhibit generation of an accumulation layer of holes under relatively thin oxide 427, e.g., because resistive material 450 can become depleted and can drop a relatively large fraction of the applied voltage.

Accordingly, without wishing to be bound by any theory, it is believed that the arrangement illustrated in FIGS. 4A-4B inhibits formation of a relatively low resistance path for accumulated holes that otherwise potentially could create a high current density spot resulting in SEB, and also potentially can inhibit hole accumulation, after a heavy ion strike. As such, embodiments of the present invention provide a power Schottky diode that includes a cathode; a semiconductor disposed over the cathode, the semiconductor including at least a first region and a second region, the second region defining a guard ring; an anode disposed over the first region and at least a portion of the guard ring, the anode including a metal, a junction between the anode and the first region defining a Schottky barrier; and an oxide disposed over the guard ring, e.g., that can provide a protective or passivating layer. Additionally, the power Schottky diode can include a resistive material disposed over at least a portion of the guard ring and at least a portion of the oxide. The resistive material can inhibit a flow of holes from the guard ring to the anode following a heavy ion strike to the guard ring.

Figure 5:
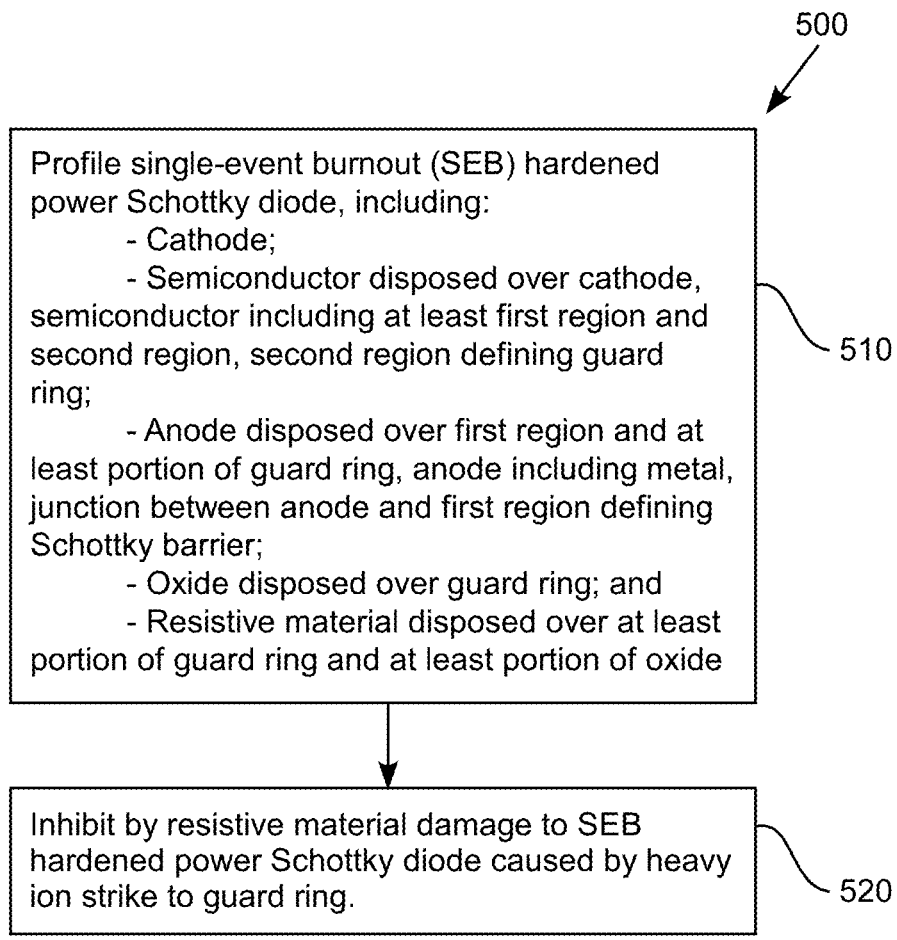
FIG. 5 illustrates an exemplary method of using a SEB hardened power Schottky diode, according to some embodiments of the present invention.

Additionally, embodiments of the present invention provide methods for inhibiting SEB following a heavy ion strike to a power Schottky diode. For example, FIG. 5 illustrates an exemplary method of using a SEB hardened power Schottky diode, according to some embodiments of the present invention. For example, method 500 illustrated in FIG. 5 can include providing a power Schottky diode (510). As described above with reference to FIGS. 4A-4B, in some embodiments, the power Schottky diode can include a cathode; a semiconductor disposed over the cathode, the semiconductor including at least a first region and a second region, the second region defining a guard ring; an anode disposed over the first region and at least a portion of the guard ring, the anode including a metal, a junction between the anode and the first defining a Schottky barrier; and an oxide disposed over the guard ring. The power Schottky diode further can include a resistive material disposed over at least a portion of the guard ring and at least a portion of the oxide. Method 500 illustrated in FIG. 5 further can include inhibiting by the resistive material a flow of holes from the guard ring to the anode following a heavy ion strike to the guard ring (520).

Design Approach and Analysis of Resistive Material

Note that resistive material 450 described above with reference to FIGS. 4A-4B can have any suitable combination of resistance and thickness for inhibiting the flow of holes from guard ring 424 to anode electrode 421 following a heavy ion strike to or in the vicinity of guard ring 424, e.g., as described in greater detail below. One exemplary criterion for resistive material 450 is that it can have sufficiently low resistance in normal operation so as to support the leakage current that flows in the PN junction formed by guard ring 424 and depletion layer 426, even at the highest usage temperature. Another exemplary criterion for resistive material 450 is that it can have sufficiently high resistance under heavy ion strike conditions so as to effectively limit the high current density between guard ring 424 and anode electrode 421, e.g., at the edge of relatively thin oxide 427. Such criteria can require a tradeoff. For example, the first criterion ideally can require a measurement of the leakage that is generated by guard ring 424. However, such a measurement is not usually available because leakage in the entire Schottky diode potentially can be dominated by the Schottky contact, rather than by guard ring 424. A simple calculation can be used to estimate just the guard ring leakage for these purposes.

For example, the leakage current density J of a large area planar PN junction under high reverse bias can be expressed as:

$$J = q\sqrt{\frac{D_n}{\tau_n}}\frac{n_i^2}{N_A} + \frac{qn_iW}{\tau_{SC}} + q\sqrt{\frac{D_p}{\tau_p}}\frac{n_i^2}{N_D} \tag{1}$$

where the symbols, meanings, and exemplary values thereof are listed in Table 1:

TABLE 1

| Symbol | Meaning | Exemplary Value |
|---|---|---|
| q | Electronic charge | $1.602 \times 10^{-19}$ Coul |
| $n_i$ | Intrinsic carrier density of silicon | $8 \times 10^{13}$ cm$^{-3}$ (at 200° C.) $1.45 \times 10^{10}$ cm$^{-3}$ (at room temperature) |
| $D_n$ | Minority carrier (electron) diffusivity on P-side (guard ring) | 180 cm$^2$/s |
| $D_p$ | Minority carrier (hole) diffusivity on N-side | 40 cm$^2$/s |
| $\tau_n$ | Minority carrier (electron) lifetime on P-side (guard ring) | 100 ns |
| $\tau_p$ | Minority carrier (hole) lifetime on N-side | 10 ns |
| $\tau_{sc}$ | Generation lifetime in depletion layer | 100 ns |
| W | Maximum width of depletion layer | 15 μm |
| $N_A$ | Guard ring average doping level | $5 \times 10^{17}$ cm$^{-3}$ |
| $N_D$ | N$^+$ backside doping level | $10^{21}$ cm$^{-3}$ |

The first term of equation (1) expresses the diffusion current of minority carriers (electrons) in P-type guard ring 424 within a diffusion length of depletion layer 426 that are collected by the reverse bias field. The last term of equation (1) is the same diffusion current but on the N-side of the junction. The exemplary values in the Table 1 are selected based on an assumption of a worst case condition in which depletion layer 426 completely occupies epitaxial layer 425 and punches through to substrate 410. Therefore, the appropriate diffusion coefficient and lifetime in the last term are selected to be the same as those for the heavily doped substrate 410. The middle term of equation (1) expresses the thermal generation current in depletion layer 426. At an exemplary worst case scenario, corresponding to a temperature of 200° C., the intrinsic density of Si is $8 \times 10^{13}$ cm$^{-3}$. Typical empirical values for lifetime and diffusivity in the various regions are used as above. For further details on such empirical values, see Baliga, "Power Semiconductor Devices," PWS Publishing (Boston), pages 169-171 (1996), the entire contents of which are incorporated by reference herein. Using these assumptions, the exemplary values listed in Table 1, and equation (1), the leakage current density from guard ring 424 is expected to be no higher than about 0.192 A/cm$^2$. For an example diode with a guard ring area of 400 sq. mils ($2.6 \times 10^{-3}$ cm$^{-2}$), it is estimated that the worst-case guard ring leakage current is about 500 μA, which is relatively small in comparison to the Schottky leakage current that would be expected to exist at this same temperature. Accordingly, it is believed that resistive material 450 primarily can support the guard ring 424 leakage.

In the above estimates, resistive material 450 is assumed to be polysilicon with a thickness l of 500 nm. However, it should be understood that other materials and thicknesses readily can be used. Resistive material 450 contacts the P-type guard ring 424 over a distance of about 1.5 mils, resulting in a contact area of about A=10$^{-3}$ cm$^2$. Illustratively, the expression further can be constrained by requiring that the guard ring drop no more than 100 mV under worst case leakage conditions in reverse bias. Therefore, in this nonlimiting example, the maximum permitted resistance of resistive material is approximately:

$$R = \frac{100 \text{ mV}}{500 \text{ μA}} = 200 \text{ Ω} \quad (2)$$

For conservatism in supporting even higher reverse leakage currents, such as potentially can occur after aging or radiation, a resistive material that is approximately 10 times less resistive than in the worst case scenario, or approximately 20Ω, can be used.

Note that in the present example, in which contact between resistive material 450 and guard ring 424 has a total cross sectional area of A=10$^{-3}$ cm$^2$ and a thickness of l=500 nm, the resistivity of the polysilicon should not exceed:

$$\rho = \frac{RA}{l} = \frac{20 \text{ Ω} \times 10^{-3} \text{ cm}^2}{5 \times 10^{-5} \text{ cm}} = 400 \text{ Ω-cm} \quad (3)$$

In one nonlimiting embodiment, such a resistivity readily can be achieved using P-type polysilicon with boron doping at a concentration of about $10^{17}$ cm$^{-3}$, corresponding to a relatively light doping for polysilicon, and the sheet resistance (ratio of the resistivity to the thickness) is 8MΩ/square. Such a doping level can be easily accommodated.

An opposing consideration is that the resistivity of resistive material 450 can be sufficiently high in value to limit the current between the guard ring 424 and anode 421 following a heavy ion strike to the guard ring 424. In order to analyze this situation, the spreading resistance of current flowing into and out of a small contact spot of cylindrical geometry is shown in cross section in FIG. 4C. It is assumed that the constriction spot of radius a is the only contact between the upper and lower half-planes of resistivity $\rho_1$ and $\rho_2$ respectively. When the spot radius is significantly smaller than the other dimensions, the spreading resistance can be expressed as:

$$R_S = \frac{\rho_1}{4a} + \frac{\rho_2}{4a} \quad (4)$$

in which the upper half plane spreading resistance is represented by the first term and the lower half plane by the second term. For further details of such an expression, see Timsit, "Electrical Contact Resistance: Properties of Stationary Interfaces," IEEE Trans. Compon. Packag. Technol. 22: 85 (1999), the entire contents of which are incorporated by reference herein. This expression can be used to estimate the increased resistance when resistive material 450 is included.

First, the constriction radius a can be estimated. Without wishing to be bound by any theory, it is believed that the constriction radius can be assumed to be about a Debye length (for the guard ring doping) in extent. The Debye length is the characteristic thickness of the accumulation layer in a MOS capacitor, and can be expressed as:

$$L_D = \sqrt{\frac{\varepsilon_{Si} kT}{q^2 N_A}} \quad (5)$$

where $\varepsilon_{Si}$ is the dielectric permittivity of silicon, kT is the thermal voltage, q is the electronic charge, and $N_A$ is the doping density (P-type) in guard ring 424. At an exemplary worst case highest usage temperature of 200° C., the Debye length in guard ring 424 is estimated to be about 7.3 nm. Using this Debye length as the spot radius a, the contact resistance to anode electrode 430 (top metal) can be estimated. For example, in one exemplary power Schottky diode, anode electrode 430 primarily includes Al, as well as intervening TiW adhesion layer 429b and Pt layer 429. The respective resistivities of these exemplary metals are listed in Table 2:

TABLE 2

| Metal | Resistivity |
|---|---|
| Platinum | 10.6 µΩ-cm |
| Aluminum (evaporated) | 4.2 µΩ-cm |
| TiW (sputtered) | 95 µΩ-cm |

Note that the average resistivity of these three layers is about 36 µΩ-cm. Using the spot size a=7.3 nm, the upper plane spreading resistance can be estimated to be about 12.4Ω. Based upon an exemplary reverse voltage of 200 V across this spreading resistance, the spike current can be estimated to be about 16 Amps. Based upon such a current being forced to flow through a spot size of radius a, the resulting current density can be estimated to be about $10^{12}$ A/cm², a relatively high value that is believed to be capable of almost immediate damage to materials such as can be used in a power Schottky diode. Note, however, that the spike current density may not actually be this severe. For example, some of the voltage can drop across the spreading resistance of the lower half plane, e.g., across P-type guard 424. This lower plane spreading resistance can be comparatively more difficult to analyze. For worst case estimation purposes, the lower half plane can be assumed to have zero resistance.

Based upon the above-mentioned metals being replaced by an exemplary resistive material 450 having a nonlimiting, illustrative resistivity of 400 Ω-cm (more than 7 orders of magnitude larger than the average metal resistivity), the estimated upper plane spreading resistance now becomes about 137 MΩ, the estimated spike current becomes about 1.46 µA, and the estimated spike current density becomes about $8.7 \times 10^5$ A/cm². While such a current density still is relatively high, it is anticipated that such a current density is compatible with normal operation of a power Schottky diode. For example, relatively high frequency Si bipolar transistors reliably can be operated at emitter current densities of $10^6$ Amps/cm² when well heat sinked. In the present power Schottky diodes, it is anticipated that this reduction in current density can be sufficient to protect the diode from SEB. For example, no damage to the diode is anticipated for short nanosecond duration current pulses of this magnitude.

The above analysis shows that a properly designed resistive material can be expected to meet the conflicting demands for reverse leakage current and reduction of the spike current density from a heavy ionizing particle.

In nonlimiting, illustrative embodiments in which resistive material 450 includes polysilicon, resistive material 450 suitably can have a thickness of about 0.01 µm to about 500 µm, e.g., of about 0.1 µm to about 50 or of about 0.25 µm to about 25 or of about 0.1 µm to about 2.5 µm, or of about 0.4 µm to about 10 µm, or of about 0.4 µm to about 0.6 µm, or of about 0.5 µm.

Process Integration

Figure 6:
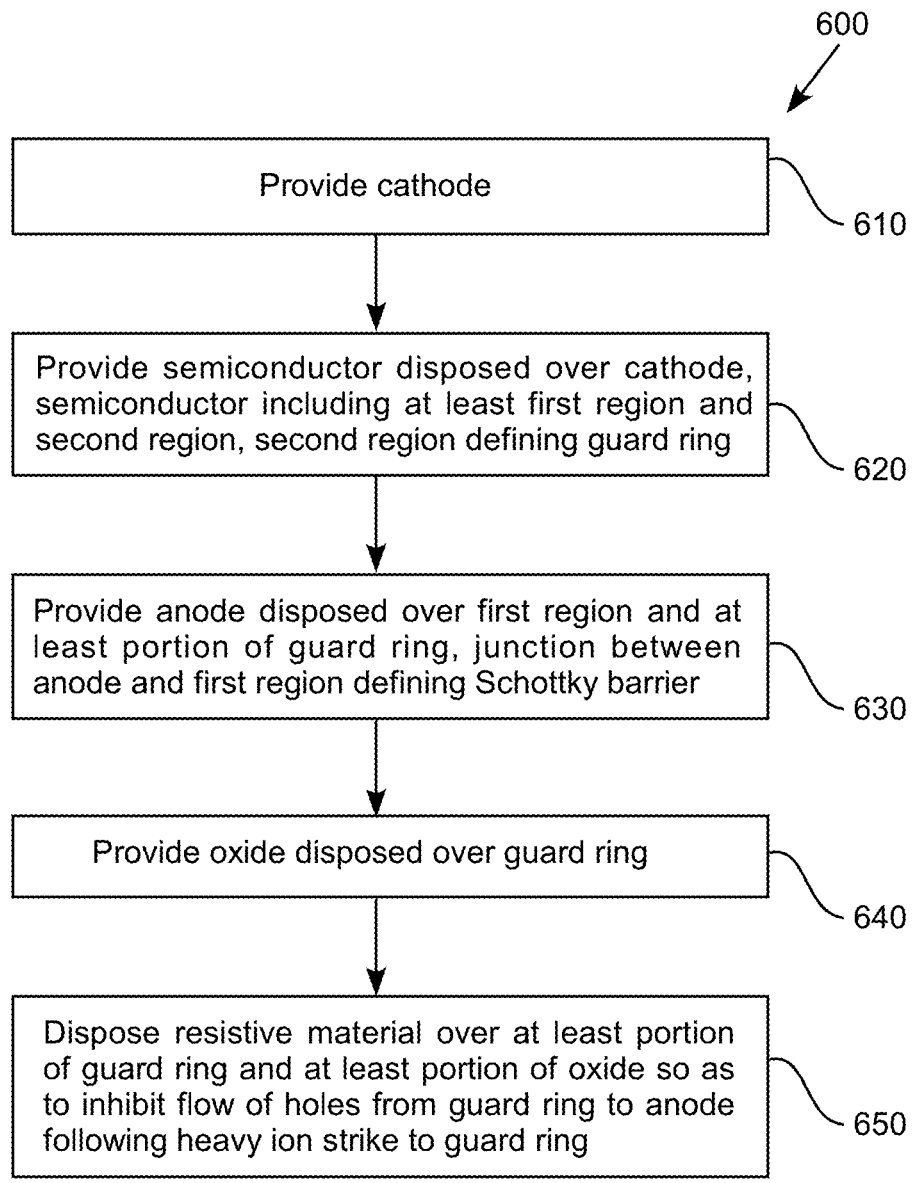
FIG. 6 illustrates an exemplary method of making a SEB hardened power Schottky diode, according to some embodiments of the present invention.

It should be appreciated that SEB hardened power Schottky diodes can be prepared using any suitable methods. FIG. 6 illustrates an exemplary method of making a SEB hardened power Schottky diode, according to some embodiments of the present invention. Method 600 illustrated in FIG. 6 can include providing a cathode (610); providing a semiconductor disposed over the cathode, the semiconductor including at least a first region and a second region, the second region defining a guard ring (620); providing an anode disposed over the first region and at least a portion of the guard ring, a junction between the anode and the first region defining a Schottky barrier (630); and providing an oxide disposed over the guard ring (640). Steps 610-640 are well known in the art. Method 600 illustrated in FIG. 6 further can include disposing a resistive material over at least a portion of the guard ring and at least a portion of the oxide; the resistive material can inhibit a flow of holes from the guard ring to the anode following a heavy ion strike to the guard ring (650). In one example, the resistive material can include doped polysilicon deposited by standard vacuum chemical vapor deposition (CVD) or low pressure chemical vapor deposition (LPCVD) techniques. The doped polysilicon resistive material then can be patterned so that it covers the edge of the guard ring and a relatively small amount of the silicon cathode region. Patterning can be done with photoresist followed by optical exposure with a photomask, followed by developing of the photoresist, followed by chemical or reactive ion etching of the exposed polysilicon, followed by removal of the photoresist by dissolution.

In some embodiments, the present resistive material is compatible with existing power Schottky diode process lines, and include additional process steps for depositing and patterning a resistive material such as polysilicon. Such additional process steps can be interposed within a typical process sequence that otherwise is unchanged. Indeed, in one nonlimiting embodiment, only six additional process steps can be used to include the present resistive material, as compared to the standard process for preparing a previously known power Schottky diode. Usefully, polysilicon is relatively commonly used in silicon processing and there are no foreseen impediments with its utilization in the present SEB hardened power Schottky diodes. Indeed, polysilicon can be silicided readily just as with crystalline silicon forming the Schottky diode metal. Additionally, polysilicon can be expected to form an ohmic contact to the guard ring, there being no significant energy barrier between polysilicon and silicon of nearly the same doping. In embodiments in which the polysilicon is doped to approximately the same level as the guard ring, there can be expected to be little if any dopant redistribution between the guard ring and the polysilicon where they are in contact.

Figure 7A:
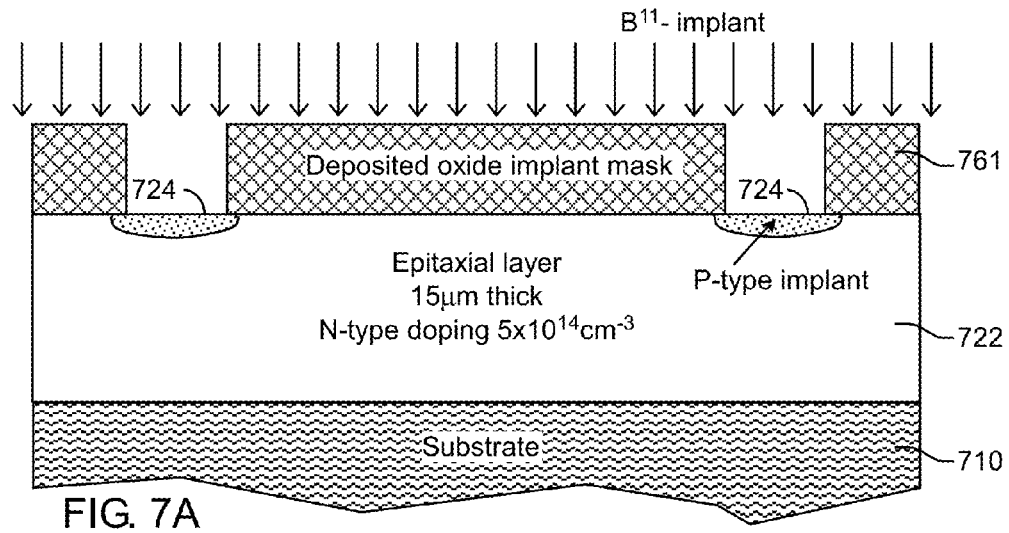
FIGS. 7A-7Q illustrate one nonlimiting, exemplary embodiment of a method of making a SEB hardened power Schottky diode, according to some embodiments of the present invention.
Figure 7B:
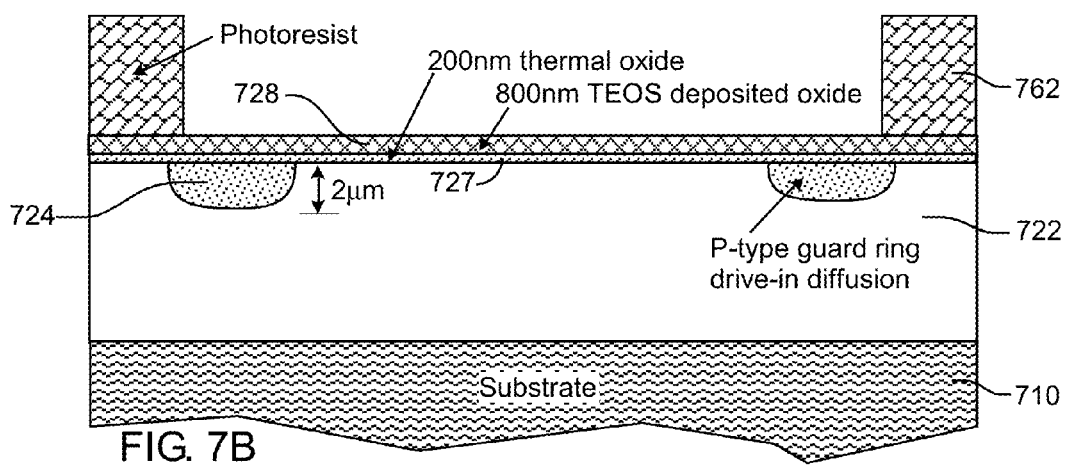
Figure 7C:
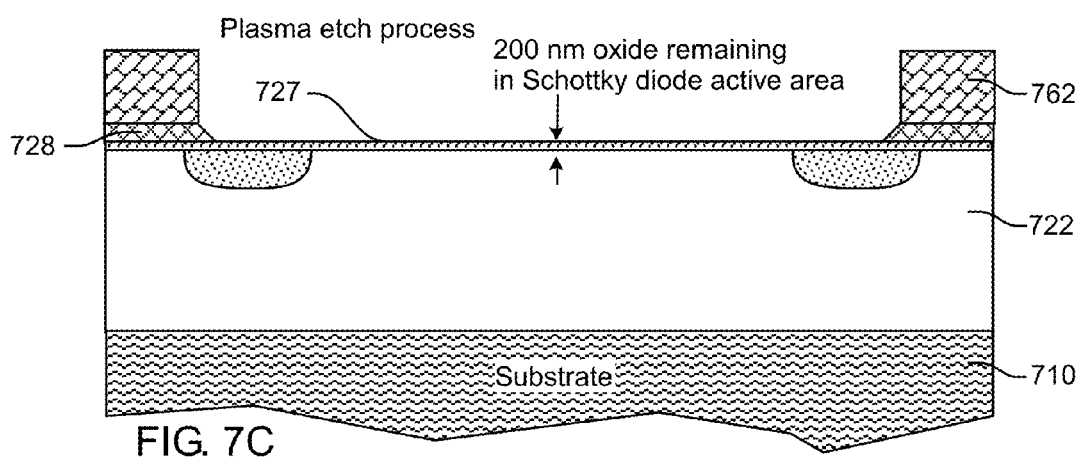
Figure 7D:
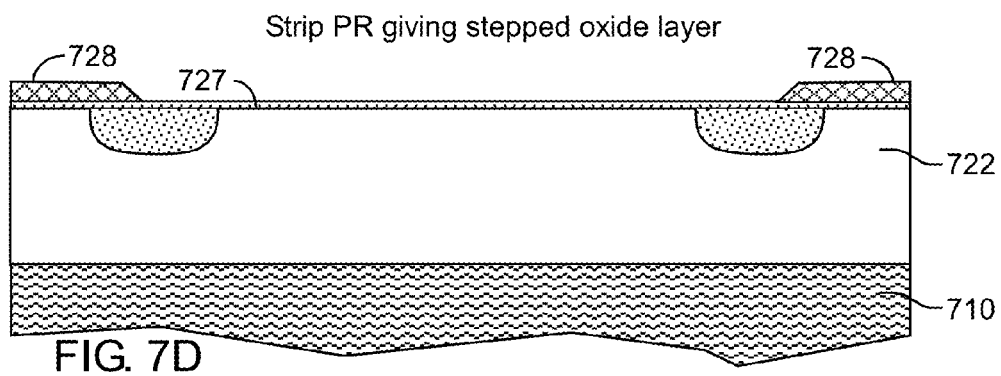
Figure 7E:
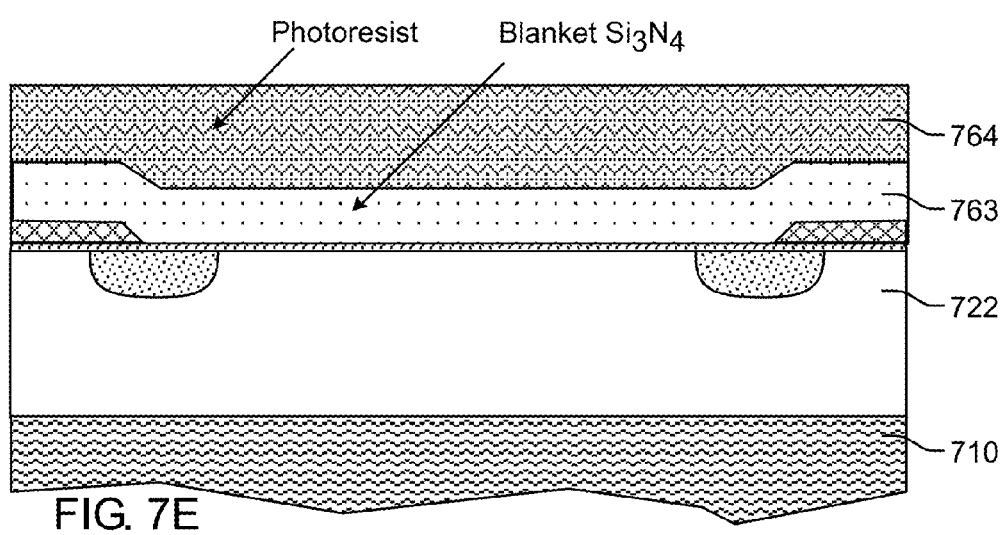
Figure 7F:
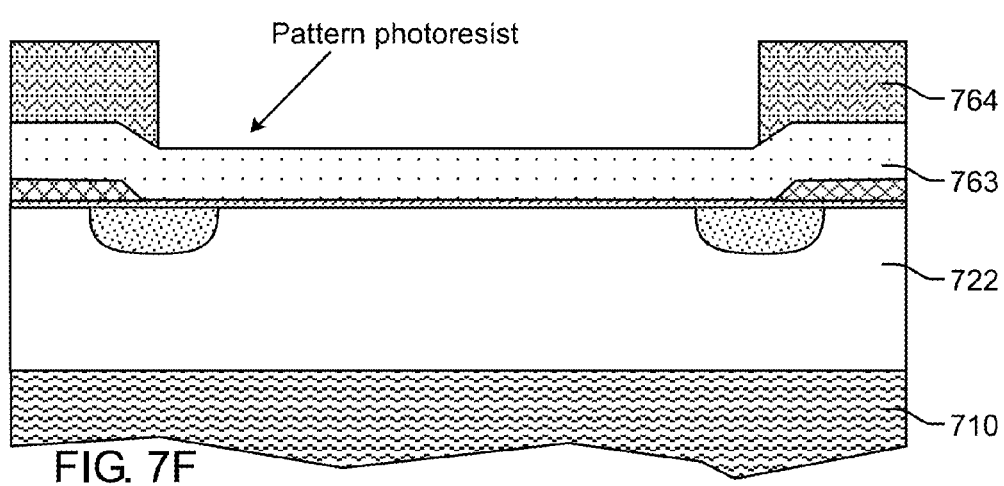
Figure 7G:
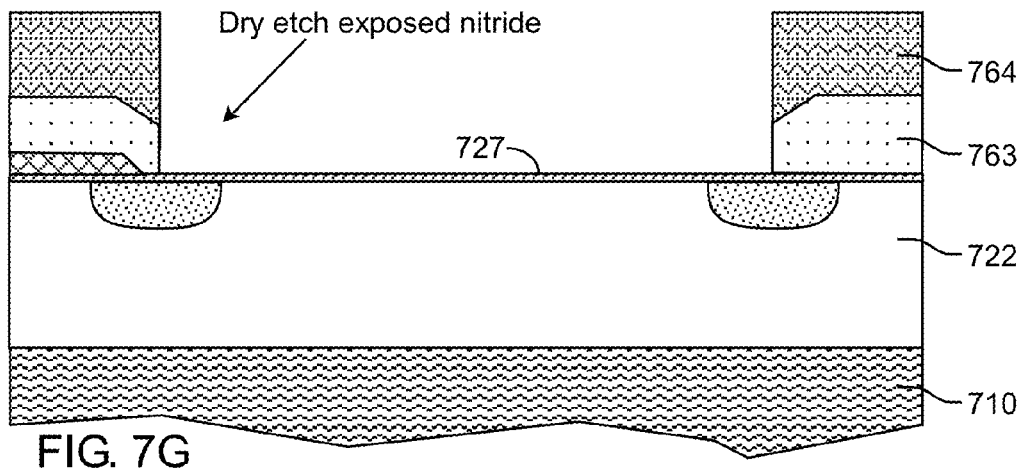
Figure 7H:
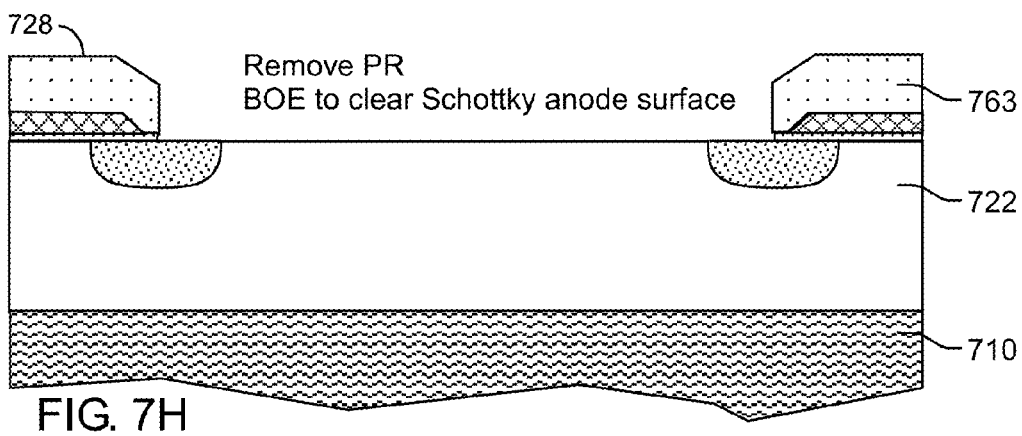
Figure 7I:
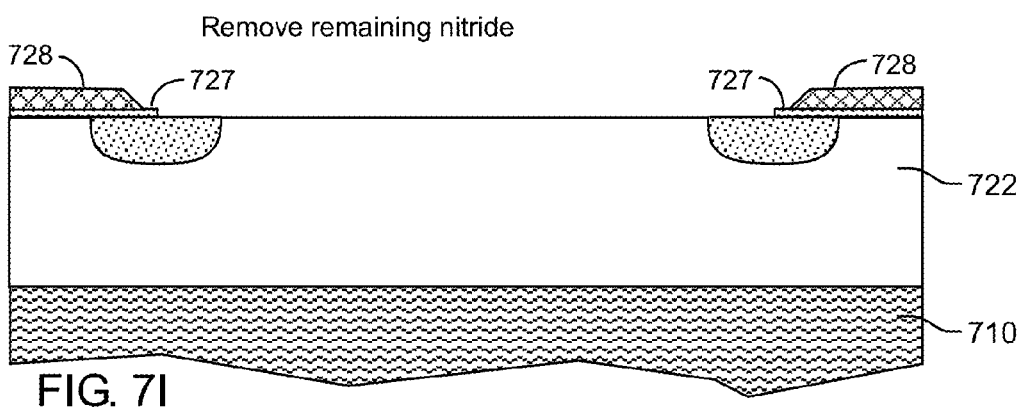
Figure 7J:
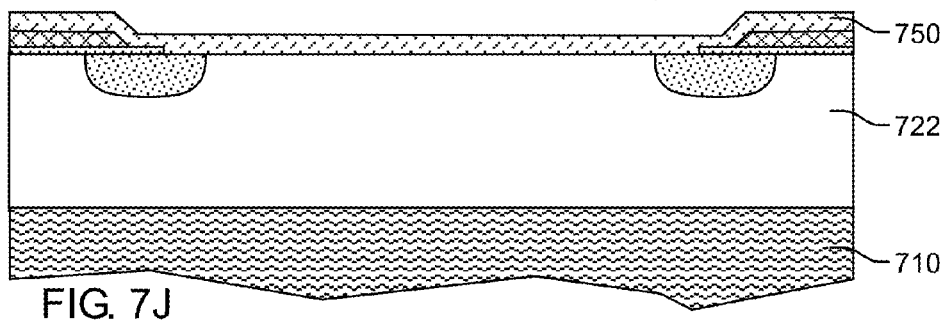
Figure 7K:
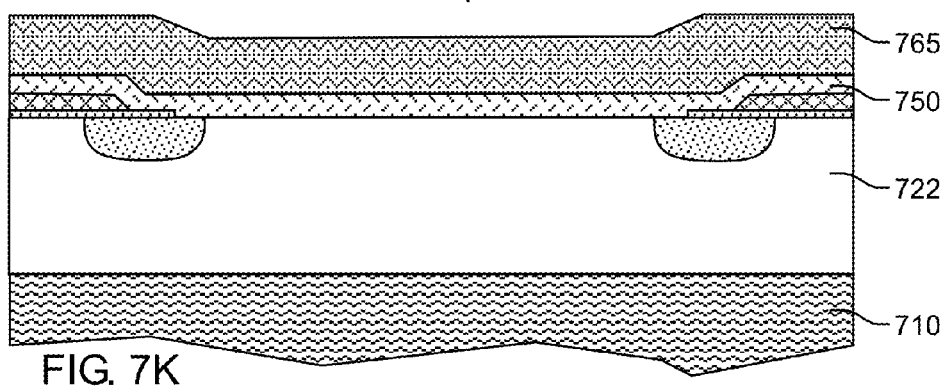
Figure 7L:
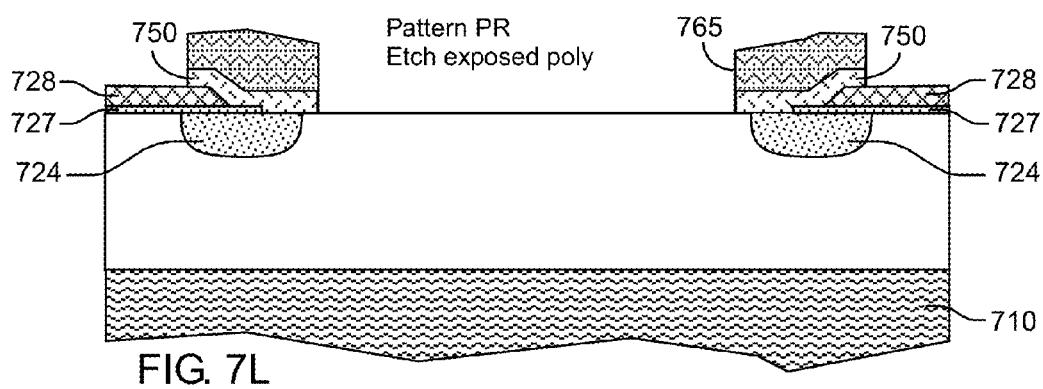
Figure 7M:
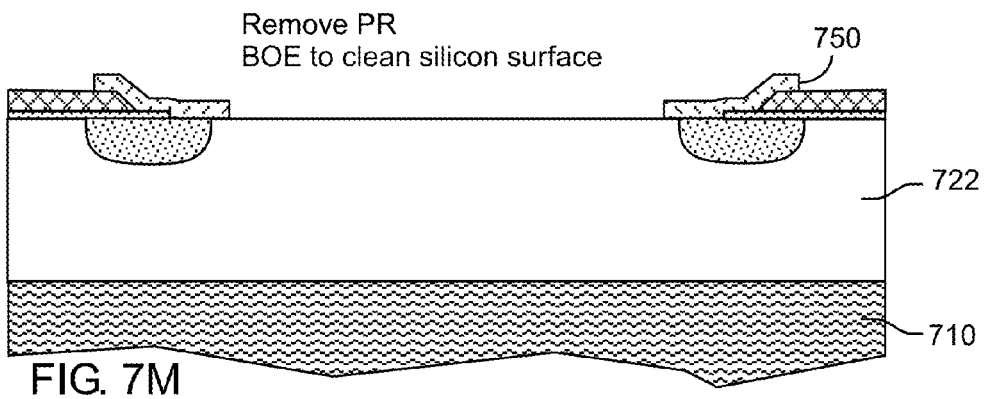
Figure 7N:
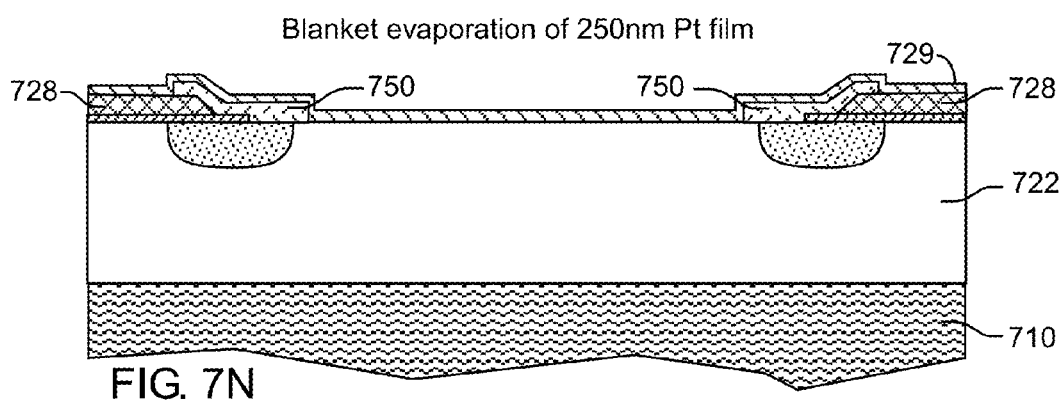
Figure 7O:
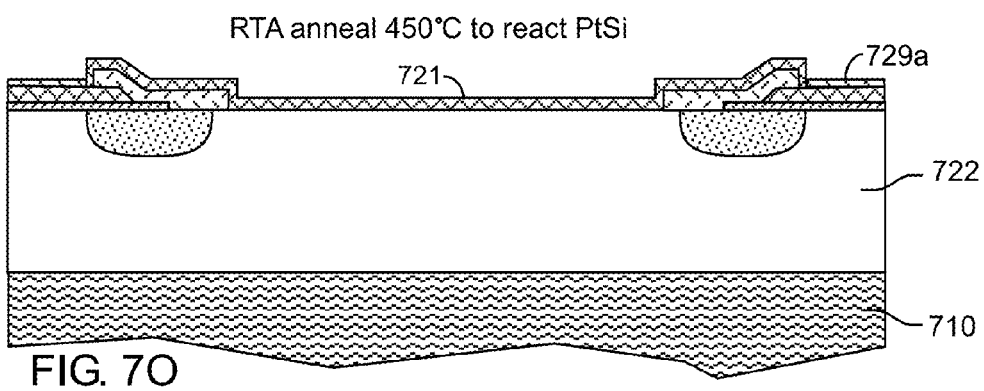
Figure 7P:
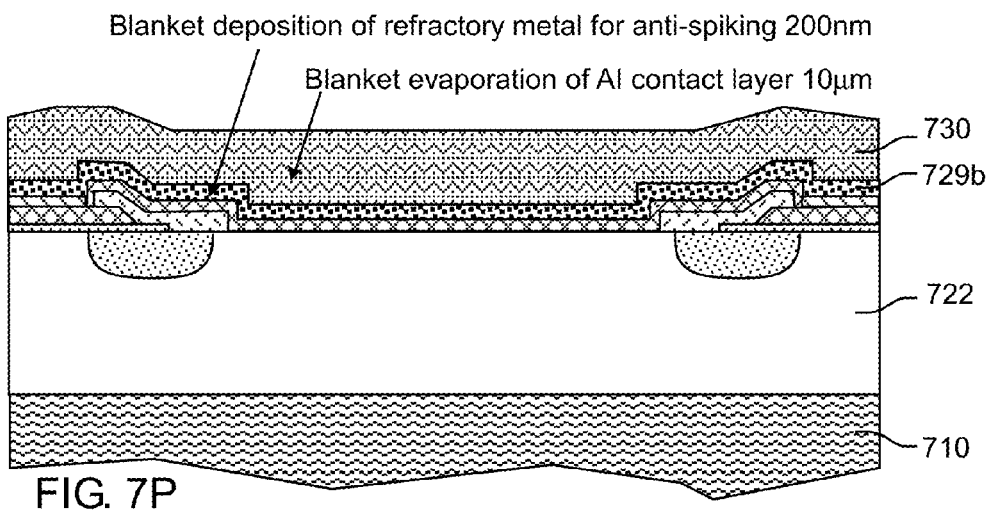
Figure 7Q:
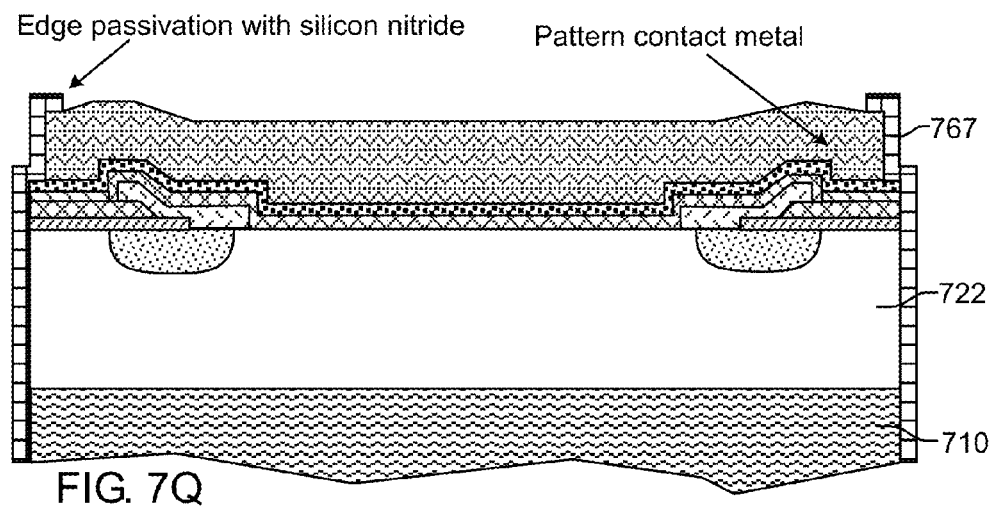

FIGS. 7A-7Q illustrate one nonlimiting, exemplary embodiment of a method of making a SEB hardened power Schottky diode, according to some embodiments of the present invention. It should be recognized that alternative methods of making a SEB hardened power Schottky diode, and alternative materials therein, suitably can be used. Additionally, FIGS. 7A-7I correspond to steps that also have been used for partially preparing previously known power Schottky diodes, and thus are described only briefly.

Referring first to FIG. 7A, an N-type (e.g., heavily doped with As, Sb, or P dopant) silicon wafer 710 with 15 µm epitaxially deposited N-type silicon (e.g., lightly doped with As, Sb, or P dopant with an exemplary concentration of $5 \times 10^{14}$ cm$^{-3}$) 722, is provided, and RCA cleaned. An oxide implant mask 761 is deposited and patterned for guard ring doping. B$^{11}$ then is implanted with a sufficient dose so as to achieve a final approximately 2 µm junction depth, with an average concentration (P-type) of about $5 \times 10^{17}$ cm$^{-3}$. Implant mask 761 subsequently is stripped, and implant activation and drive in anneal are performed to form guard ring 724.

Referring to FIG. 7B, the resulting intermediate structure of the prior steps is BOE cleaned, and a thermal oxide having a thickness of approximately 200 nm is grown so as to form relatively thin oxide 727. The P-type guard ring implant diffuses to an exemplary final junction depth of about 2 μm. Approximately 800 nm of TEOS oxide then is deposited on relatively thin oxide 727 so as to form relatively thick oxide 728. Photoresist (PR) then is deposited and patterned for use in Schottky active region definition so as to form patterned mask 762.

Referring to FIG. 7C, the resulting intermediate structure of the prior steps is plasma etched so as to remove TEOS 728 in the Schottky anode region, with an etch stop at the thermal oxide 727. Referring to FIG. 7D, the photoresist of the resulting intermediate structure of the prior steps then is stripped, leaving a stepped oxide surface.

Referring to FIG. 7E, low pressure chemical vapor deposition (LPCVD) $Si_3N_4$ 763 then is blanket deposited over the resulting intermediate structure of the prior steps, followed by deposition of photoresist 764. Referring now to FIG. 7F, the photoresist 764 is patterned for preparation of the Schottky metal region by selectively exposing a portion of the $Si_3N_4$. Referring now to FIG. 7G, the exposed $Si_3N_4$ is dry etched, leaving a portion of the thin oxide layer 727 exposed.

Referring now to FIG. 7H, photoresist 764 is removed, and the resulting intermediate structure BOE (buffered oxide etch) cleaned to clear the silicon for preparation of anode 721. Referring now to FIG. 7I, the remaining nitride 763 is removed, and the resulting intermediate structure is plasma cleaned.

Referring now to FIG. 7J, a layer of resistive material 750, such as polysilicon, is deposited over the resulting intermediate structure of the prior steps. In one nonlimiting embodiment, polysilicon doped with a sufficient amount of boron (B) to obtain a resistivity of about 400 Ω-cm is blanket deposited over the resulting intermediate structure of the prior steps using low pressure chemical vapor deposition (LPCVD), to a thickness of 0.5 μm. However, it should be appreciated that any other suitable deposition method suitably can be used, such as plasma deposition, e-beam (electron-beam) evaporation, or any of various types of chemical vapor deposition including LPCVD. Additionally, it should be appreciated that any suitable combination of resistivity and thickness of polysilicon can be used. For example, in the calculation above, it was assumed that the polysilicon thickness is 0.5 μm with a resistivity of 400 Ω-cm. In this case, the sheet resistivity (ratio of resistance to thickness) is 8 MΩ/square. Equivalent functionality could be achieved with for example half that thickness and half the resistivity, keeping the sheet resistance the same. In this case, a polysilicon film of about 0.25 μm in thickness with a resistivity of 200 Ω-cm can be used. Other examples keeping the sheet resistivity approximately equal to this value can be used. Additionally, it should be appreciated that any other resistive material 750 having a suitable combination of resistivity and thickness can be used, including but not limited to those provided elsewhere herein.

Referring now to FIG. 7K, a layer of photoresist 765 is deposited over resistive material 750. Referring now to FIG. 7L, photoresist 765 can be patterned so as to define region(s) in which resistive material 750 is to remain, and after such patterning, exposed regions of resistive material 750 are removed using any suitable method, e.g., chemically etched using BOE (buffered oxide etch) or with various other solutions incorporating HF (hydrofluoric acid); using other selective wet chemical etchants such as HBr (hydrogen bromide) or TMAH (tetramethyl ammonium hydroxide); or using plasma etching with; a HBr/Cl plasma. In some embodiments, resistive material 750 is patterned so as to be disposed over at least a portion of guard ring 724, at least a portion of relatively thin oxide 727, and at least a portion of relatively thick oxide 728.

Referring now to FIG. 7M, photoresist 765 is removed, and the resulting intermediate structure of the prior steps is BOE cleaned so as to clean the exposed surface of semiconductor 722. Referring now to FIG. 7N, layer 729 including metal is deposited over the exposed surface of semiconductor 722, over resistive material 750, and over relatively thick oxide 728. In one example, layer 729 includes, or consists essentially of, platinum. Layer 729 can be deposited to any suitable thickness, illustratively 250 nm, using any suitable deposition technique, illustratively evaporation.

Referring now to FIG. 7O, the resulting intermediate structure of the prior steps is annealed, e.g., subjected to rapid thermal annealing (RTA) so as to react the portion of metal layer 729 in contact with silicon in semiconductor 722 and in resistive material 750 so as to form anode 721, e.g., a metal silicide, the remaining portion of metal layer 729 forming metal layer 729a. In one nonlimiting example, layer 729 includes, or consists essentially of, platinum, that is subjected to RTA at an exemplary temperature of 450° C., causing the platinum to react with silicon in semiconductor 722 (e.g., epitaxially deposited silicon) and in resistive material 750 (e.g., polysilicon) so as to form platinum silicide anode 721. In one nonlimiting example, 250 nm of platinum in layer 729 reacts with (consumes) about 330 nm Si in semiconductor 722 (e.g., epitaxially deposited silicon) and in resistive material 750 (e.g., polysilicon) so as to produce about 793 nm of $PtSi_2$. Note that metal, e.g., platinum, in layer 729 may not necessarily react with relatively thick oxide 728, thus providing metal layer 729a.

Referring now to FIG. 7P, one or more adhesion layer(s) 729b optionally are suitably deposited over anode 721 and layer 729a, e.g., using blanket deposition, followed by suitable deposition of anode electrode 730, e.g., using blanket evaporation. In one nonlimiting embodiment, adhesion layer(s) 729b include TiW having a thickness of about 200 nm, and anode electrode 730 includes Al having a thickness of about 10 μm. Note that other materials and thicknesses suitably can be used. Additionally, note that adhesion layer(s) 729b also can inhibit spiking of material from anode electrode 730 into resistive material 750 or into semiconductor 722.

Referring now to FIG. 7Q, anode electrode 730 can be patterned and the edges of the resulting structure can be passivated, e.g., with silicon nitride, LTO (low temperature oxide), thermal oxide, or with polymers such as rubberized polymers.

ALTERNATIVE EMBODIMENTS

Figure 8A:
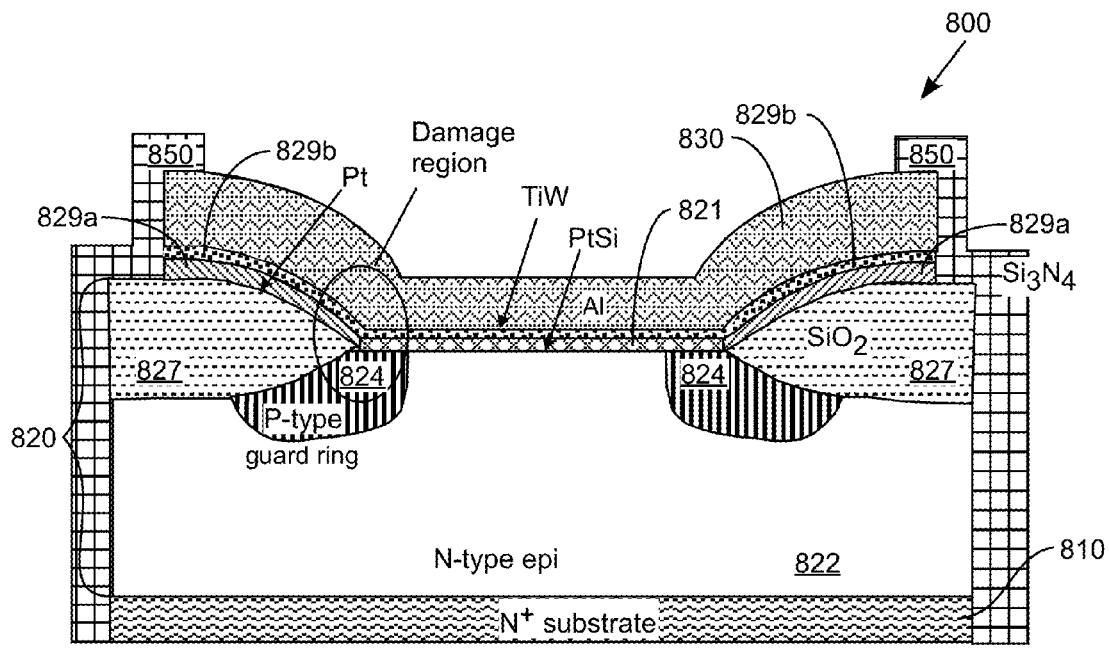
FIG. 8A illustrates cross section of another exemplary, previously known power Schottky diode.

It should be appreciated that the present resistive materials suitably can be included in any power Schottky diode so as to reduce the likelihood of SEB. For example, FIG. 8A illustrates a cross section of another exemplary, previously known power Schottky diode 800 formed using LOCOS (local oxidation of silicon). As illustrated in FIG. 8A, previously known power Schottky diode 800 includes substrate 810, active region 820, anode electrode 830 (which also may be referred to as a "top metal"), and cathode electrode (which also may be referred to as a "back metal," not specifically illustrated). Active region 820 is disposed over a first surface of substrate 810, anode electrode 830 is disposed on active region 820, and the cathode electrode is disposed over a second surface of substrate 820 that is opposite to the first surface in a manner analogous to cathode electrode 140 described above with reference to FIGS. 1A-1B. In the previously known power Schottky diode 800 illustrated in FIG. 8A, substrate 810 is formed of silicon; anode electrode 830 includes aluminum and includes or is disposed over adhesion layer(s) 829b, such as titanium tungsten (TiW) for facilitating durable contact between anode electrode 830 and active region 820 and inhibiting "spiking" of metal into substrate 810 or into active region 820; and the cathode electrode includes a titanium layer followed by Au—Ge alloy or Ni/Au layered metal. The edges of power Schottky diode 800 can be passivated using $Si_3N_4$ 850.

Figure 8B:
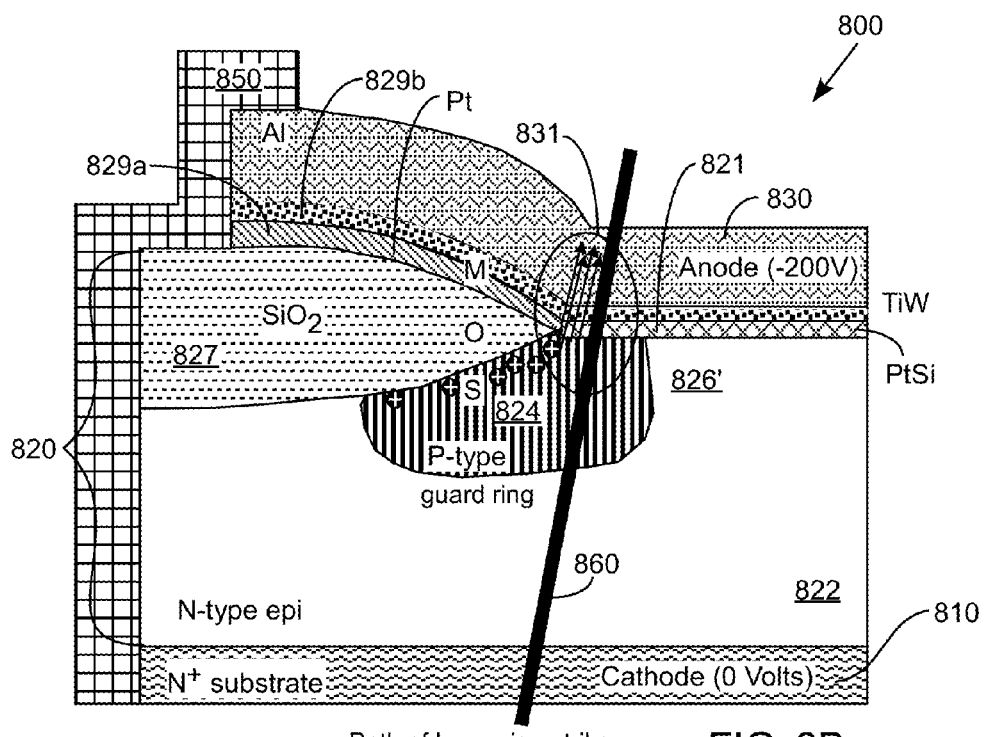
FIG. 8B illustrates an exemplary mechanism for generation in the previously known power Schottky diode of FIG. 8A of a SEB damage site caused by a heavy ion strike, according to some embodiments of the present invention.

Active region 820 can include anode 821, semiconductor 822, and oxide, e.g., silicon dioxide, 827 which can be formed using LOCOS. Metal layer 829a, such as platinum, can be disposed over oxide 827. The portion of substrate 810 upon which active region 820 is disposed can be doped, e.g., $N^+$ doped, so as to define a cathode contact, which can be at substantially the same voltage as is cathode electrode 840. Semiconductor 822 can be disposed over a first surface of substrate 810, and can include epitaxially deposited silicon (which also can be referred to as "epi"). Different regions of semiconductor 822 can be doped differently than one another in a manner analogous to that described above with reference to FIGS. 1A-1B. In the illustrated example, region 824 of semiconductor 822 is doped so as to define a guard ring, e.g., a P-type guard ring. In the previously known power Schottky diode 800 illustrated in FIG. 8A, anode 821 is disposed over semiconductor 822 and at least a portion of guard ring 824, and includes platinum silicide ($PtSi_2$) or other suitable silicide, such as $MoSi_2$ (molybdenum silicide), $TiSi_2$ (titanium silicide), or others. Anode 821 can be at substantially the same voltage as is anode electrode 830, which is disposed over anode 821. For example, as is illustrated in FIG. 8B, anode 821 can be at a voltage of −200 volts, and cathode (substrate) 810 can be at a voltage of 0 volts. A junction between anode 821 and semiconductor 822 can define a Schottky barrier in a manner well known in the art. The guard ring can reduce the electrical field gradient at the edge of the Schottky barrier in a manner well known in the art.

Without wishing to be bound by any theory, FIG. 8B illustrates an exemplary mechanism for generation in the previously known power Schottky diode of FIG. 8A of a SEB damage site caused by a heavy ion strike, according to some embodiments of the present invention. In FIG. 8B, the heavy ion strike to or near guard ring region 824 occurs under a condition of reverse bias, in which top electrode 830 is, for example, at −200 V, while cathode (substrate) 810 is at ground potential (0 V), corresponding to a typical reverse bias voltage for space applications. Without wishing to be bound by any theory, it is believed that the heavy ion strike creates plasma 860 of holes and electrons within at least semiconductor 822, and potentially also extending into substrate 810 in a manner analogous to that described above with reference to FIG. 3. Without wishing to be bound by any theory, it is believed that such plasma 860 of holes and electrons potentially can short P-type guard ring 824 to the same voltage as substrate 810, e.g., to ground, for a few nanoseconds, which is believed to be sufficient time for a series of events to occur that potentially can cause SEB in a manner analogous to that described above with reference to FIG. 3.

For example, without wishing to be bound by any theory, it is believed that, immediately after the heavy ion strike, plasma 860 forms an accumulation layer of holes that can drastically lower the sheet resistance of guard ring 824 under oxide 827, and that the path of least resistance for the accumulated holes to reach the negative anode 821 is at the high current spot region 831 illustrated in FIG. 8B, corresponding to the inner edge of contact between oxide 827 and guard ring 824, and potentially can concentrate the current density at the edge of oxide 827 at a region nearest to the particle strike. Without wishing to be bound by any theory, it is believed that such a relatively high spot current density, if allowed to flow for sufficient time is capable of causing damage by localized melting of one or more of oxide 827, semiconductor 822, anode 821, and anode electrode 830. Additionally, without wishing to be bound by any theory, it is believed that a relatively high hole density is created at the MOS capacitor accumulation layer because of the large reverse voltage that is suddenly imposed onto a MOS capacitor-like structure defined by anode electrode 830, oxide 827, and guard ring 824. For example, free holes that are majority carriers in guard ring 824 potentially can be attracted to the interface between guard ring 824 and oxide 827, thus creating relatively high hole density. Additionally, without wishing to be bound by any theory, it is believed that the current in N-type epitaxial region 825, e.g., lightly doped N-type epitaxial silicon, potentially can exacerbate the damage in a manner analogous to that described above with reference to FIG. 3.

Figure 9A:
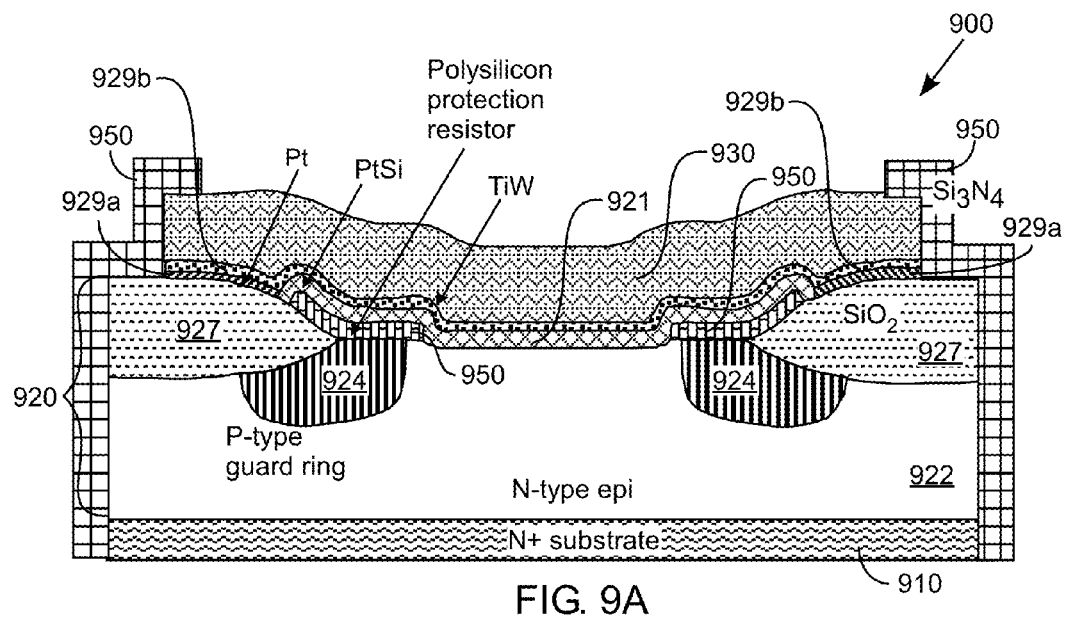
FIGS. 9A-9B illustrate a cross section of an alternative SEB hardened power Schottky diode, according to some embodiments of the present invention.
Figure 9B:
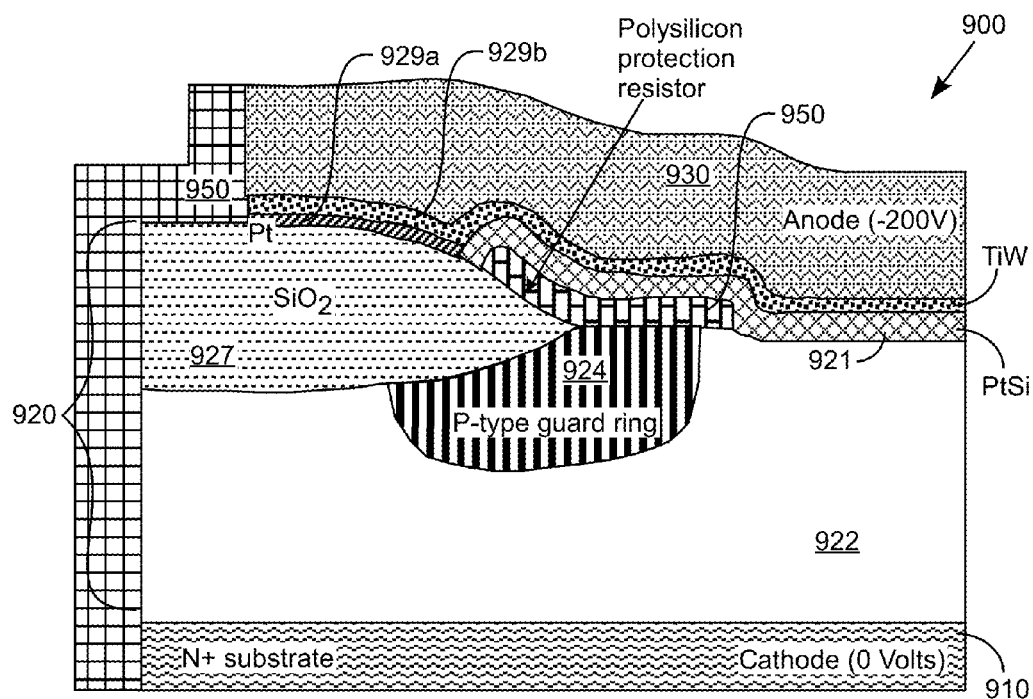

FIGS. 9A-9B illustrate a cross section of an alternative SEB hardened power Schottky diode, according to some embodiments of the present invention. As illustrated in FIGS. 9A-9B, SEB hardened power Schottky diode 900 includes substrate 910, active region 920, anode electrode 930 (which also may be referred to as a "top metal"), resistive material 950, and a cathode electrode (which also may be referred to as a "back metal", not specifically illustrated in FIGS. 9A-9B). Active region 920 can be disposed over a first surface of substrate 910, anode electrode 930 can be disposed over active region 920, and the cathode electrode can be disposed on a second surface of substrate 910 that is opposite to the first surface in a manner analogous to cathode electrode 140 described above with reference to FIGS. 1A-1B. Substrate 910 can include any suitable semiconductive material, such as silicon. Additionally, anode electrode 930 can include any suitable conductive material or combination of materials, and optionally can include or be disposed over one or more adhesion layer(s) 929b for facilitating durable contact between anode electrode 930 and other components of SEB hardened power Schottky diode 900, and for inhibiting "spiking" of metal from anode electrode 930 into epitaxial layer 922 or into guard ring 924. For example, anode 921 defining the Schottky barrier can include any of a number of elemental metals, such as Pt, Pd, Ti, Co, Cr, Ni, W, Mo or Ta. Such metal also can be deposited in region 929a. When this metal is contacting the surface of substrate 910 or resistive material 950, it reacts with that material, e.g., silicon, as part of the device processing and forms a metal silicide that forms the anode of the diode, 921, such as $PtSi_2$, $Pd_2Si$, $TiSi_2$, $Co_2Si$, $CoSi$, $CoSi_2$, $CrSi_2$, $NiSi$, $NiSi_2$, $WSi_2$, $MoSi_2$, or $TaSi_2$. The anti-spiking (adhesion) metal layer 929b can include, for example, a refractory metal such as Mo, W, Ta, Ti, or V, or refractory metal alloy such as TiW, TaN, or TiN. The top anode electrode 930 can include, for example, Al, Au, Cu, or Ag. Exemplary power Schottky diode 900 and components thereof can have dimensions analogous to those described above with reference to FIGS. 1A-1B.

As illustrated in FIGS. 9A-9B, active region 920 can include anode 921, semiconductor 922, oxide, e.g., silicon dioxide, 927 which can be formed using LOCOS, and resistive material 950. The portion of substrate 910 upon which active region 920 is disposed can be doped, e.g., $N^+$ doped, so as to define a cathode, which can be at substantially the same voltage as is cathode electrode 940. Semiconductor 922 can be disposed over the first surface of substrate 910, and can include a crystalline or other suitable semiconductor material, such as epitaxially grown silicon. Different regions of semiconductor 922 can be doped differently than one another in a manner analogous to that described above with reference to FIGS. 4A-4B.

In SEB hardened power Schottky diode 900 illustrated in FIGS. 9A-9B, anode 921 is disposed over semiconductor 922 and at least a portion of guard ring 924. Anode 921 can include any suitable conductive material, such as platinum silicide ($PtSi_2$), palladium silicide ($Pd_2Si$), titanium silicide ($TiSi_2$), cobalt silicide ($Co_2Si$, CoSi, or $CoSi_2$), chromium silicide ($CrSi_2$), nickel silicide (NiSi or $NiSi_2$), tungsten silicide ($WSi_2$), molybdenum silicide ($MoSi_2$), or tantalum silicide ($TaSi_2$). Anode 921 can be at substantially the same voltage as is anode electrode 930, which is disposed over anode 921. For example, anode 921 can be at a voltage of −200 volts, and cathode contact (substrate) 910 can be at a voltage of 0 volts. A junction between anode 921 and semiconductor 922 can define a Schottky barrier in a manner well known in the art. The guard ring can reduce the electrical field gradient at the edge of the Schottky barrier in a manner well known in the art. Oxide 927 can be disposed over guard ring 924. For example, oxide 927 can include a relatively thick silicon oxide material, e.g., $SiO_2$, 927 formed using LOCOS.

Additionally, in the embodiment illustrated in FIGS. 9A-9B, SEB hardened power Schottky diode 900 includes resistive material 950 disposed over at least a portion of guard ring 924 and at least a portion of oxide 927. Without wishing to be bound by any theory, it is believed that resistive material 950 can inhibit a flow of holes from guard ring 924 to anode 921 following a heavy ion strike to guard ring 924 in a manner analogous to that described above with reference to FIGS. 4A-4D. Illustratively, resistive material 950 can include polysilicon, e.g., polysilicon that can be doped P-type with boron analogously as can be guard ring 924 such that resistive material 950 can form an ohmic contact to guard ring 924. Such ohmic contact between resistive material 950 and guard ring 924 potentially can support leakage current generated thermally in the guard ring-to-epi depletion layer under reverse bias. Other exemplary materials that can be included in resistive material include, are described above with reference to FIGS. 4A-4B. In some embodiments, resistive material 950 can be extended slightly into the Schottky diode region where resistive material 950 can form a P (resistive material)-to-N (epitaxial silicon) junction in parallel with the Schottky diode region. Such an arrangement can be considered to replace the P (guard ring)-to-N (epitaxial silicon) junction in parallel with the Schottky contact in a previously known power Schottky diode in a manner analogous to that described above with reference to FIGS. 4A-4D. Additionally, in the embodiment illustrated in FIGS. 9A-9B, resistive material 950 also can be disposed over at least a portion of oxide 927. The metal gate MOS structure described above with reference to FIGS. 1A-1B therefore can be replaced with a MOS structure that includes, from top to bottom, metal-polysilicon (or other resistive material)-oxide-silicon. Based upon a particle strike occurring, the P-type guard ring still can be brought close to ground potential. However, without wishing to be bound by any theory, it is believed that the arrangement illustrated in FIGS. 9A-9B may inhibit generation of an accumulation layer of holes under oxide 927, e.g., because resistive material 950 can become depleted and can drop a relatively large fraction of the applied voltage, and thus may inhibit SEB in a manner analogous to that described above with reference to FIGS. 4A-4B.

It should be understood that any suitable combination of steps can be used to prepare SEB hardened power Schottky diodes such as provided herein. As one example, power Schottky diode 900 illustrated in FIGS. 9A-9B suitably can be prepared using method 600 illustrated in FIG. 6 using steps that are similar to, or dissimilar from, those illustrated in FIGS. 7A-7Q. Illustratively, oxide 927 illustrated in FIGS. 9A-9B can be formed using LOCOS techniques known in the art by thermally oxidizing regions of substrate 910, rather than by depositing one or more separate oxide materials onto substrate 910.

Figure 10A:
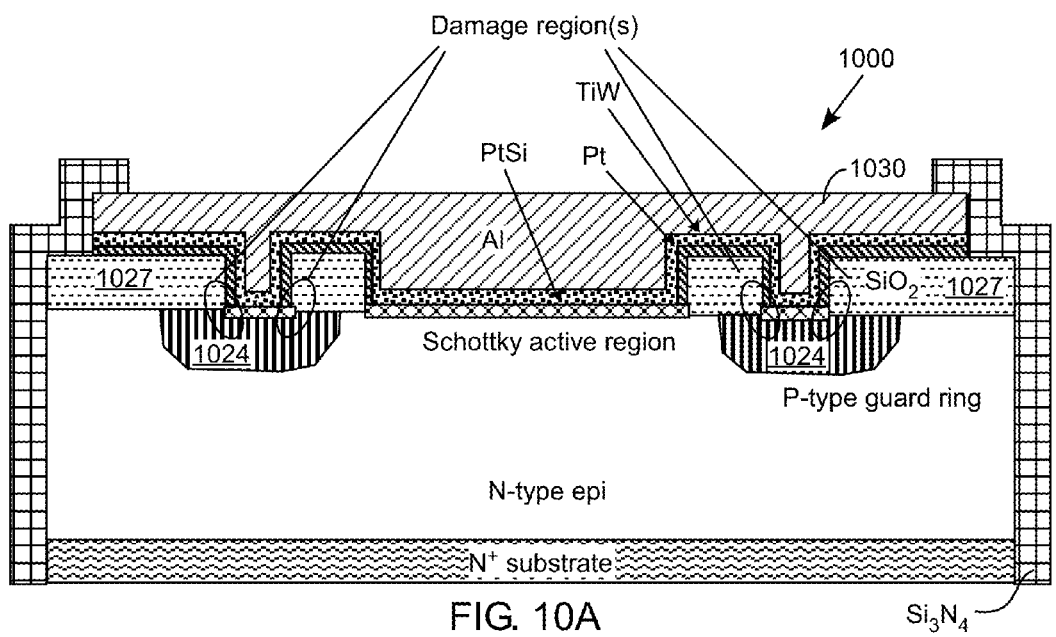
FIGS. 10A-10B illustrate cross sections of another exemplary, previously known power Schottky diode.
Figure 10B:
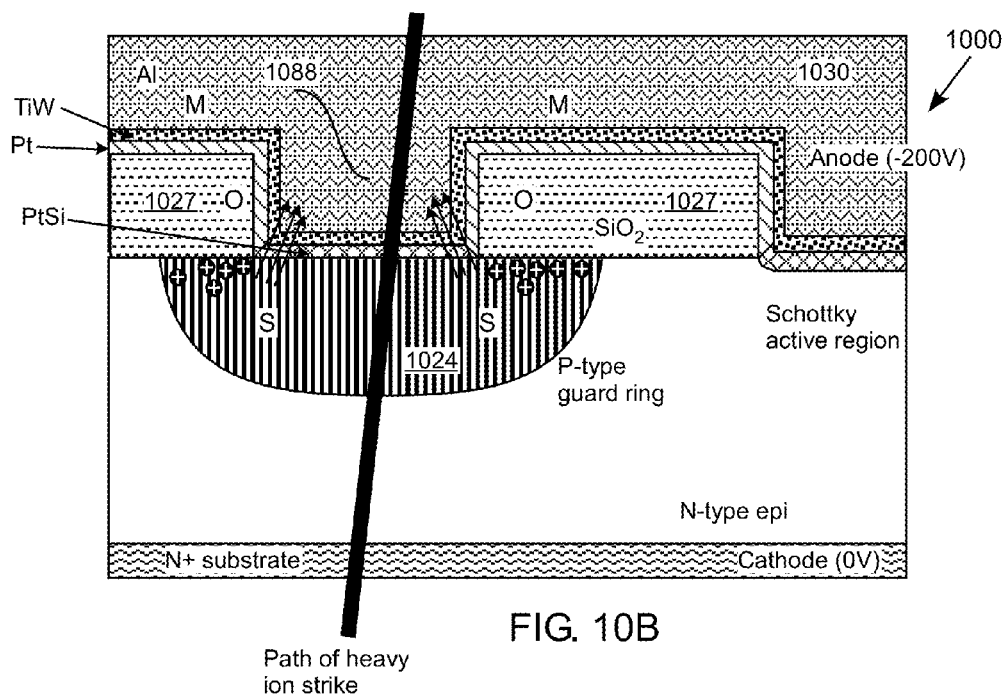

FIGS. 10A-10B illustrate cross sections of another exemplary, previously known power Schottky diode 1000. In this implementation, P-type guard ring 1024 is contacted with a separate opening or trench 1088 in overlaying insulating oxide 1027. Using such a geometry, the N Schottky active region can be silicided separately from the P-type guard ring 1024. The silicide reaction rate is sometimes dependent on the silicon doping type and species. This can cause difficulties in the processing, such as lack of planarity, that can be reduced or avoided using the geometry illustrated in FIGS. 10A-10B. In other respects, guard ring 1024 can serve to spread the edge electric field and improving the leakage and breakdown voltage, as in other geometries. Unfortunately, this type of diode geometry can suffer from SEB under a heavy ion strike, similarly as other previously known constructions. For example, at the edges of the trenches, the current density can be very high as the positive charges within and induced by the heavy ion strike are driven towards the negative anode 1030 in reverse bias. Potential damage regions are shown in FIG. 10A.

FIG. 10B illustrates an expanded view near guard ring 1024. The layers of anode metal 1030 contacting guard ring 1024 and the Schottky active region are (starting from the silicon and working upward): $Si/PtSi_2/TiW/Al$. The $PtSi_2$ can be formed by first depositing Pt and then performing a heat treatment that causes the siliciding reaction to form $PtSi_2$. The TiW layer is a refractory metal and adhesion layer that prevents the thick Al anode metal from "spiking" or diffusing into the underlying active Schottky region or guard ring in the trench. In the non-contacted surfaces where metal lies atop the oxide, e.g., $SiO_2$, 1027 the layers are: $Si/SiO_2/Pt/TiW/Al$. These non-contacted regions form a MOS (metal-oxide-semiconductor) structure as demarcated in FIG. 10B that includes an anode-to-oxide-to-P-type guard ring. Normally, such a MOS structure has no bias across it, because the anode metal 1030 makes contact to guard ring 1024 inside the trench, and the guard ring is at the same potential as the metal anode. Under reverse bias conditions, such as with −200 V on anode 1030 and 0 V on the cathode (not specifically illustrated), for example, guard ring 1024 is essentially at the −200 V anode potential, and the MOS structure has zero bias. Without wishing to be bound by any theory, it is believed that when a heavy ion strike occurs, as shown in FIG. 10B, P-type guard ring 1024 suddenly and temporarily becomes shorted to the cathode at 0 V. Now the MOS structure is biased heavily into accumulation, and holes, in abundance in P-type guard ring 1024 are attracted to the Si—SiO$_2$ surface. They flow along the surface and are collected by the negative anode potential at the edge of the trench. There can be two vulnerable edges in the trench in this geometry, both the inner and outer edge. Both are capable of being damaged by the high current density that flows in the presence of the heavy ion strike. Once the current density flows, the same arguments for the high potential for damage can be made as for other diode geometries such as discussed above.

Figure 11A:
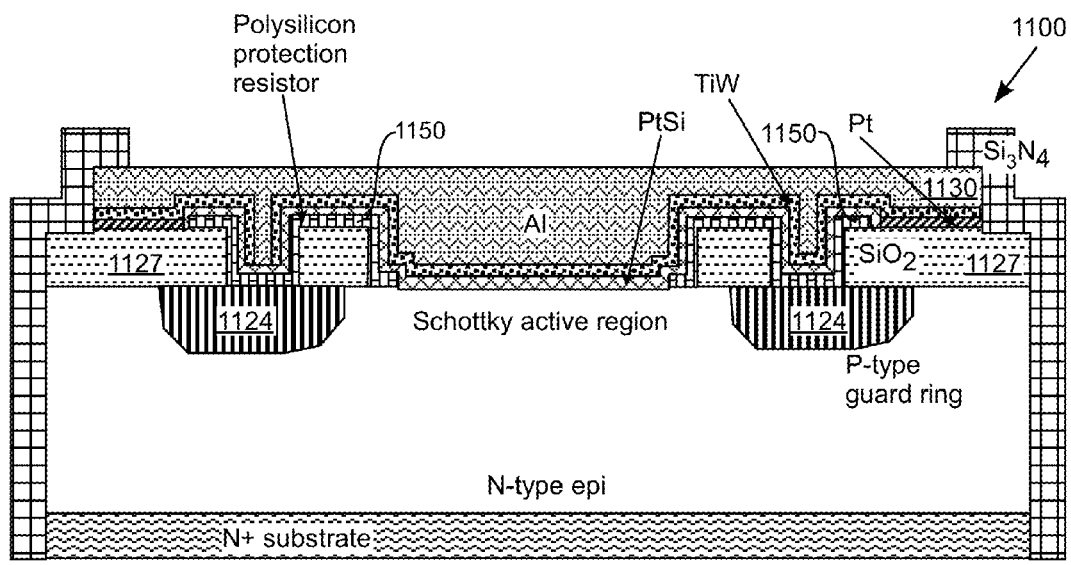
FIGS. 11A-11B illustrate cross sections of another alternative SEB hardened power Schottky diode, according to some embodiments of the present invention.
Figure 11B:
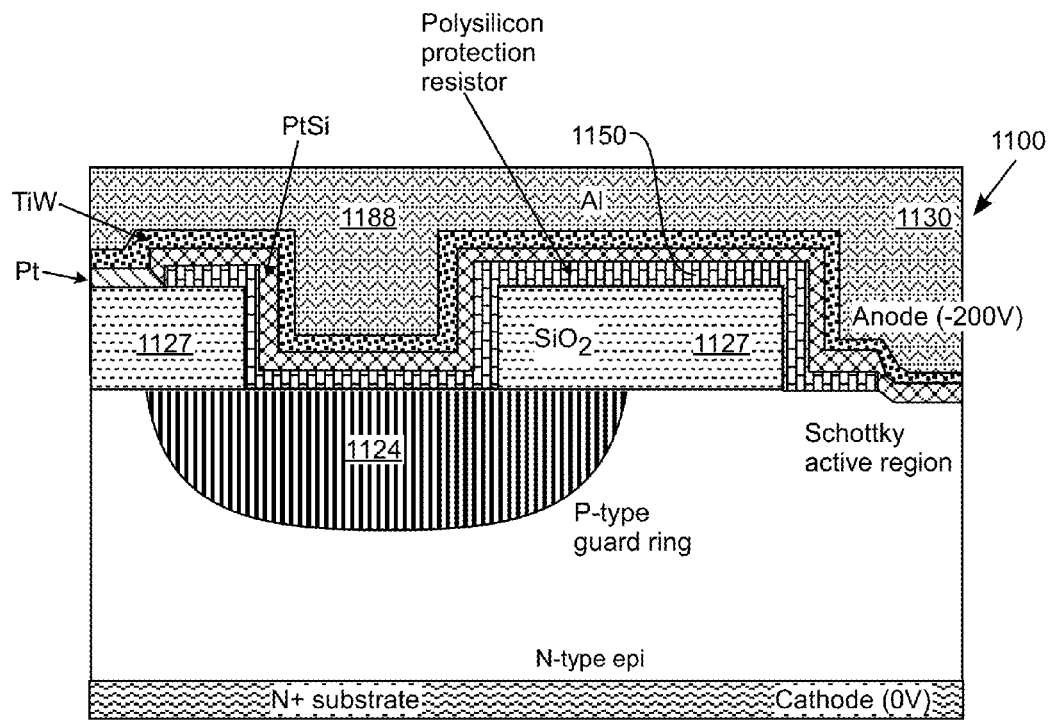

FIGS. 11A-11B illustrate cross sections of another alternative SEB hardened power Schottky diode 1100, according to some embodiments of the present invention. In the embodiment illustrated in FIG. 11A, polysilicon protection resistor layer 1150 is added to a Schottky diode construction that otherwise is similar to power Schottky diode 1000, e.g., includes trench 1188 anode 1130, guard ring 1124, and oxide 1127. In the embodiment illustrated in FIGS. 11A-11B, resistance provided by protection resistor layer 1150 can reduce the high current density under heavy ion strikes. In other respects trench 1188 still functions to bias guard ring 1124 to the same potential as anode 1130 under normal conditions. Under high reverse bias, the resistance of protection resistor layer 1150 is chosen to be sufficiently low to support the maximum leakage current anticipated. Therefore protection resistor layer 1150 may not impede the function of the trench contact to provide guard ring 1124 with its proper bias. Under high current density conditions such as occurring during a heavy ion strike, the resistance of protection resistor layer 1150 is chosen to be sufficiently high to limit the current and prevent the damaging high current density to flow at the edges of the trench. This resistance value tradeoff is analogous to that described previously in the case of other embodiments. In one non-limiting example, a boron doped P-type polysilicon protection resistor layer 1150 having a thickness of approximately 500 nm with a resistivity of approximately 400 ohm $\Omega$-cm is also suitable in this case.

FIG. 11B shows an expanded view in the region of the trench. In some embodiments, the blanket polysilicon deposition and patterning step to form protection resistor layer 1150 can be inserted into the process flow just before the Schottky metal deposition (Pt Schottky metal is used in this example). Then the silicidation of the Schottky and the polysilicon resistor can occur simultaneously. As such, P-type guard ring 1124 can be arranged in series with polysilicon protection resistor layer 1150. The Schottky diode functionality under normal forward and reverse conditions is unimpeded by the presence of protection resistor layer 1150. Without wishing to be bound by any theory, it is believed that when a heavy ion strike happens, protection resistor layer 1150 protects the guard ring at the edges of the trench because the current density is much lower there, thus reducing or preventing damage due to SEB.

While various illustrative embodiments of the invention are described above, it will be apparent to one skilled in the art that various changes and modifications can be made therein without departing from the invention. For example, FIGS. 7A-7Q set forth only one exemplary process flow for preparing a SEB hardened power Schottky diode, and it should be understood that a wide variety of other methods suitably can be used. The appended claims are intended to cover all such changes and modifications that fall within the true spirit and scope of the invention.

What is claimed:

1. A power Schottky diode, including:
a cathode;
a semiconductor disposed over the cathode, the semiconductor including at least a first region and a second region, the second region defining a guard ring;
an anode disposed over the first region and at least a portion of the guard ring, the anode including a metal, a junction between the anode and the first region defining a Schottky barrier;
an oxide disposed over a portion of the guard ring;
a resistive material disposed over at least a portion of the guard ring and at least a portion of the oxide, the resistive material being disposed between the guard ring and the anode at all portions of the guard ring not covered by the oxide so as to inhibit all direct contact between the guard ring and the anode, the resistive material having a resistance of at least 100 $\Omega$-cm so as to inhibit a flow of holes from the guard ring to the anode following a heavy ion strike to the guard ring.

2. The power Schottky diode of claim 1, wherein the anode further is disposed over at least a portion of the resistive material.

3. The power Schottky diode of claim 2, wherein the anode further is disposed over the entirety of the resistive material.

4. The power Schottky diode of claim 1, wherein the oxide includes:
a first, relatively high quality and relatively thin oxide material disposed over the guard ring; and
a second, relatively low quality and relatively thick oxide material disposed over the first oxide material.

5. The power Schottky diode of claim 1, wherein the resistive material includes polysilicon.

6. The power Schottky diode of claim 1, further including a substrate defining the cathode, the semiconductor being epitaxially disposed over the substrate.

7. The power Schottky diode of claim 6, wherein:
the second region is doped with a P-type dopant so as to define the guard ring; and
a third region of the semiconductor is doped with an N-type dopant.

8. A method of forming a power Schottky diode, the method including:
providing a cathode;
providing a semiconductor disposed over the cathode, the semiconductor including at least a first region and a second region, the second region defining a guard ring;
providing an anode disposed over the first region and at least a portion of the guard ring, a junction between the anode and the first region defining a Schottky barrier;
providing an oxide disposed over the guard ring; and
disposing a resistive material over at least a portion of the guard ring and at least a portion of the oxide, the resistive material being disposed between the guard ring and the anode at all portions of the guard ring not covered by the oxide so as to inhibit all direct contact between the guard ring and the anode, the resistive material having a resistance of at least 100 $\Omega$-cm so as to inhibit a flow of holes from the guard ring to the anode following a heavy ion strike to the guard ring.

9. The method of claim 8, wherein the anode further is disposed over at least a portion of the resistive material.

10. The method of claim 9, wherein the anode further is disposed over the entirety of the resistive material.

11. The method of claim 8, wherein providing the oxide includes:
disposing a first, relatively high quality and relatively thin oxide material over the guard ring; and disposing a second, relatively low quality and relatively thick oxide material over the first oxide material.

12. The method of claim 8, wherein the resistive material includes polysilicon.

13. The method of claim 8, further including providing a substrate defining the cathode, and wherein providing the semiconductor includes epitaxially disposing the semiconductor over the substrate.

14. The method of claim 13, including doping the second region with a P-type dopant so as to define the guard ring, and doping a third region of the semiconductor with an N-type dopant.

15. A method including:
providing a power Schottky diode including:
   a cathode;
   a semiconductor disposed over the cathode, the semiconductor including at least a first region and a second region, the second region defining a guard ring;
   an anode disposed over the first region and at least a portion of the guard ring, the anode including a metal, a junction between the anode and the first defining a Schottky barrier;
   an oxide disposed over the guard ring;
   a resistive material disposed over at least a portion of the guard ring and at least a portion of the oxide, the resistive material being disposed between the guard ring and the anode at all portions of the guard ring not covered by the oxide so as to inhibit all direct contact between the guard ring and the anode, the resistive material having a resistance of at least 100 Ω-cm; and
   inhibiting by the resistance of the resistive material a flow of holes from the guard ring to the anode following a heavy ion strike to the guard ring.

16. The method of claim 15, wherein the anode further is disposed over at least a portion of the resistive material.

17. The method of claim 16, wherein the anode further is disposed over the entirety of the resistive material.

18. The method of claim 15, wherein the oxide includes:
   a first, relatively high quality and relatively thin oxide material disposed over the guard ring; and
   a second, relatively low quality and relatively thick oxide material disposed over the first oxide material.

19. The method of claim 15, wherein the resistive material includes polysilicon.

20. The method of claim 15, further including providing a substrate defining the cathode, and wherein the semiconductor is epitaxially disposed over the substrate.

21. The method of claim 15, wherein:
   the second region is doped with a P-type dopant so as to define the guard ring; and
   a third region of the semiconductor is doped with an N-type dopant.

* * * * *